US012666683B2

(12) United States Patent
Tamura

(10) Patent No.: US 12,666,683 B2
(45) Date of Patent: Jun. 23, 2026

(54) SEMICONDUCTOR DEVICE WITH REDUCED LEAKAGE

(71) Applicant: TAIWAN SEMICONDUCTOR MANUFACTURING COMPANY, LTD., Hsinchu (TW)

(72) Inventor: Motoki Tamura, Kawasaki City (JP)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 596 days.

(21) Appl. No.: 18/151,168

(22) Filed: Jan. 6, 2023

(65) Prior Publication Data

US 2024/0079464 A1    Mar. 7, 2024

Related U.S. Application Data

(60) Provisional application No. 63/404,012, filed on Sep. 6, 2022.

(51) Int. Cl.
*H10D 64/23* (2025.01)
*H10D 30/01* (2025.01)
*H10D 30/60* (2025.01)
*H10D 64/01* (2025.01)
*H10D 64/27* (2025.01)
*H10D 62/17* (2025.01)

(52) U.S. Cl.
CPC ......... *H10D 64/258* (2025.01); *H10D 30/023* (2025.01); *H10D 30/611* (2025.01); *H10D 64/01* (2025.01); *H10D 64/512* (2025.01); *H10D 62/371* (2025.01)

(58) Field of Classification Search
CPC .. H10D 64/258; H10D 30/023; H10D 64/512; H10D 62/371; H10D 89/10–105; H10D 84/0135–0142; H10D 84/0172–0179; H10D 64/311–519; H10D 62/299
See application file for complete search history.

(56) References Cited

U.S. PATENT DOCUMENTS

| | | | | |
|---|---|---|---|---|
| 10,157,925 | B1 * | 12/2018 | Kuo | H10D 84/0167 |
| 2007/0170469 | A1 * | 7/2007 | Wu | H10D 62/156 |
| | | | | 257/E29.136 |
| 2014/0167169 | A1 * | 6/2014 | He | H10D 89/611 |
| | | | | 257/491 |

* cited by examiner

*Primary Examiner* — Shahed Ahmed
(74) *Attorney, Agent, or Firm* — Maschoff Brennan

(57) ABSTRACT

A semiconductor device includes a first well and a second well. The first well is configured to operate as a back gate terminal of a first transistor. The second well is separated from the first well, and is configured to operate as a back gate terminal of a second transistor. Each of a first source/ drain terminal of the second transistor, and a first source/ drain terminal of the first transistor and the back gate terminal of the first transistor are coupled to each other.

20 Claims, 18 Drawing Sheets

600

SEMICONDUCTOR DEVICE WITH REDUCED LEAKAGE

CROSS-REFERENCE TO RELATED APPLICATION

This application claims priority benefit of U.S. Provisional Application Ser. No. 63/404,012, filed Sep. 6, 2022, the full disclosures of which are incorporated herein by reference.

BACKGROUND

A subthreshold leakage current and a gate-induced drain leakage (GIDL) current are main factors of leakage currents of an off-state transistor. The GIDL current flows from a drain terminal of the transistor to a back gate terminal of the transistor, and is the most dominant in a high voltage range.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
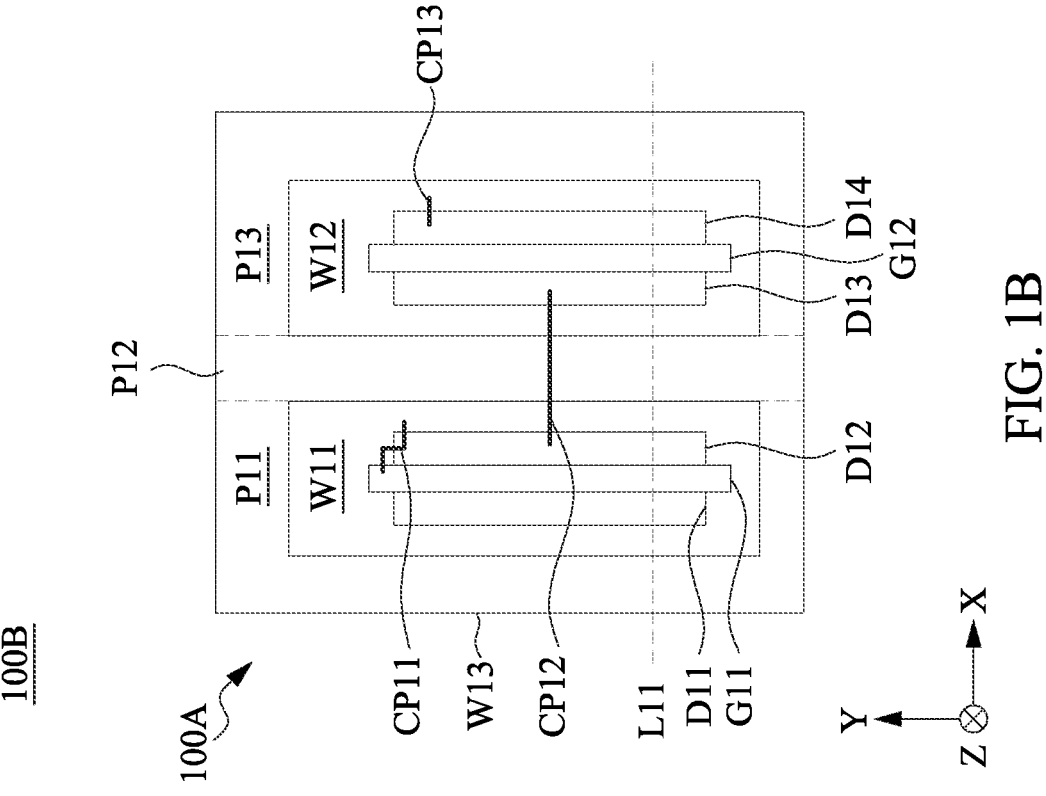
FIG. 1B is a layout diagram of the semiconductor device shown in FIG. 1A, in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. The term mask, photolithographic mask, photomask and reticle are used to refer to the same item.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

Figure 1A:
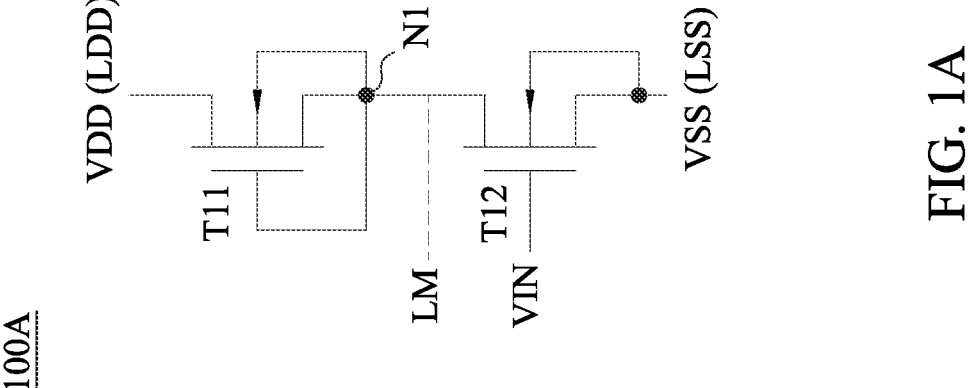
FIG. 1A is a circuit diagram of a semiconductor device, in accordance with some embodiments of the present disclosure.

FIG. 1A is a circuit diagram of a semiconductor device 100A, in accordance with some embodiments of the present disclosure. In some embodiments, the semiconductor device 100A includes multiple transistors. As illustratively shown in FIG. 1A, the semiconductor device 100A includes transistors T11 and T12.

In some embodiments, each of the transistors T11 and T12 has a gate terminal, a source terminal, a drain terminal and a back gate terminal. In some embodiments, each of the source terminal and the drain terminal is referred to as a source/drain terminal. In some embodiments, each of the transistors T11 and T12 is configured to operate according to a voltage level of the corresponding back gate terminal.

For example, the transistor T11 is turned on when a voltage level of the back gate terminal of the transistor T11 plus a voltage level of the gate terminal of the transistor T11 is larger than or equal to a threshold voltage level. The transistor T11 is turned off when the voltage level of the back gate terminal of the transistor T11 plus the voltage level of the gate terminal of the transistor T11 is smaller than the threshold voltage level.

As illustratively shown in FIG. 1A, the drain terminal of the transistor T11 is configured to receive a reference voltage signal VDD. Each of the source terminal of the transistor T11, the gate terminal of the transistor T11 and the back gate terminal of the transistor T11 is coupled to the node N11. Each of the source terminal of the transistor T12 and the back gate terminal of the transistor T12 is configured to receive a reference voltage signal VSS. The drain terminal of the transistor T12 is coupled to the node N11. The gate terminal of the transistor T12 is configured to receive an input voltage signal VIN.

In the embodiment shown in FIG. 1A, the reference voltage signals VDD and VSS have voltage levels LDD and LSS, respectively. The input voltage signal VIN has the voltage level LSS. The node N11 has a voltage level LM between the voltage levels LDD and LSS. In some embodiments, the voltage level LDD is higher than the voltage level LSS, the voltage level LM is approximately equal to a half of the voltage level LDD, and the voltage level LSS is approximately equal to zero.

In some approaches, a gate-induced drain leakage (GIDL) current flows from a drain terminal of a transistor to a back gate terminal of the transistor. The GIDL current is increased when a voltage difference between the drain terminal and the back gate terminal is increased.

Compared to the above approaches, in some embodiments of the present disclosure, the transistors T11 and T12 shares a voltage difference between the voltage levels LDD and LSS. The drain terminal of the transistor T11 and the back gate terminal of the transistor T11 have a voltage difference between the voltage levels LDD and LM, which is smaller than a voltage difference between the voltage levels LDD and LSS. The drain terminal of the transistor T12 and the back gate terminal of the transistor T12 have a voltage difference between the voltage levels LM and LSS, which also is smaller than the voltage difference between the voltage levels LDD and LSS. Accordingly, GIDL currents of the transistors T11 and T12 are reduced.

FIG. 1B is a layout diagram 100B of the semiconductor device 100A shown in FIG. 1A, in accordance with some embodiments of the present disclosure. Referring to FIG. 1A and FIG. 1B, the layout diagram 100B illustrates a structure of the semiconductor device 100A. In some embodiments, the semiconductor device 100A includes wells, gate structures and doped regions for forming the transistors T11 and T12.

As illustratively shown in FIG. 1B, the semiconductor device 100A includes wells W11-W13, gate structures G11, G12 and dope regions D11-D14. Each of the gate structures G11, G12 and the dope regions D11-D14 extends along a Y-direction. The dope region D11, the gate structure G11, the dope regions D12-D13, the gate structure G12 and the dope region D14 are arranged in order along a X-direction. A Z-direction points out from the paper. In some embodiments, the X-direction, the Y-direction and the Z-direction are perpendicular with each other.

As illustratively shown in FIG. 1B, the well W13 includes portions P11-P13 arranged in order along the X-direction. The well W11 is disposed on the portion P11. The well W12 is disposed on the portion P13. The portion P12 is formed between the wells W11 and W12, to separate the wells W11 and W12 from each other.

As illustratively shown in FIG. 1B, each of the doped regions D11 and D12 is disposed in the well W11. Each of the doped regions D13 and D14 is disposed in the well W12. The gate structure G11 is disposed between the doped regions D11 and D12. The gate structure G12 is disposed between the doped regions D13 and D14.

As illustratively shown in FIG. 1B, the gate structure G11 is coupled to the doped region D12 and the well W11 through a conductive path CP11. The doped region D12 and the well W11 are coupled to the doped region D13 through a conductive path CP12. The doped region D14 is coupled to the well W12 through a conductive path CP13. In some embodiments, the conductive paths CP11-CP13 are implemented by conductive segments, vias and/or contacts between the elements shown in FIG. 1B.

Referring to FIG. 1B and FIG. 1A, the wells W11 and W12 correspond to the back gate terminals of the transistors T11 and T12, respectively. The gate structures G11 and G12 correspond to the gate terminals of the transistors T11 and T12, respectively. The dope regions D11-D14 correspond to the drain terminal of the transistor T11, the source terminal of the transistor T11, the drain terminal of the transistor T12 and the source terminal of the transistor T12, respectively. The conductive paths CP11-CP12 correspond to the node N11.

Figure 1C:
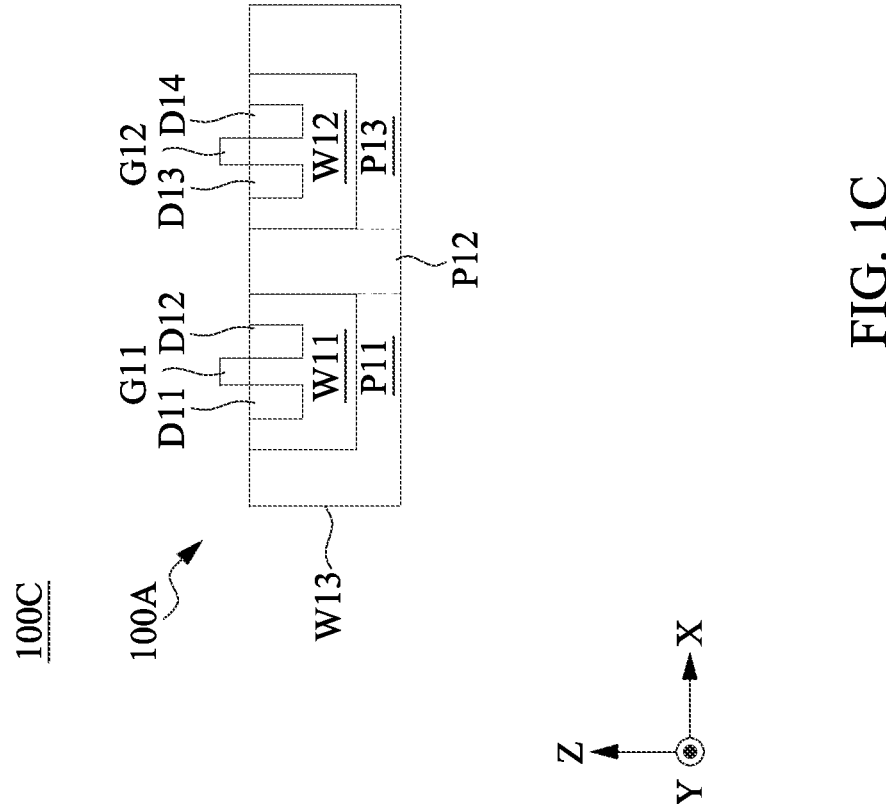
FIG. 1C is a cross section diagram of the semiconductor device along a line shown in FIG. 1B, in accordance with some embodiments of the present disclosure.

FIG. 1C is a cross section diagram 100C of the semiconductor device 100A along a line L11 shown in FIG. 1B, in accordance with some embodiments of the present disclosure. As illustratively shown in FIG. 1C, the Y-direction points into the paper. The portion P12 is interposed between the wells W11 and W12, to separate the wells W11 and W12 from each other.

In some embodiments, each of the well W13 and the doped region D11 is configured to receive the reference voltage signal VDD. Each of the gate structure G11, the well W11 and the doped regions D12, D13 has the voltage level LM. The gate structure G12 is configured to receive the input voltage signal VIN. Each of the well W12 and the doped region D14 is configured to receive the reference voltage signal VSS.

In some embodiments, each of the doped regions D11-D14 and the well W13 corresponds to a first conductive type, and each of the wells W11 and W12 corresponds to a second conductive type different from the first conductive type. For example, each of the doped regions D11-D14 and the well W13 is implemented by N-type materials, and each of the wells W11 and W12 is implemented by P-type materials.

Figure 2A:
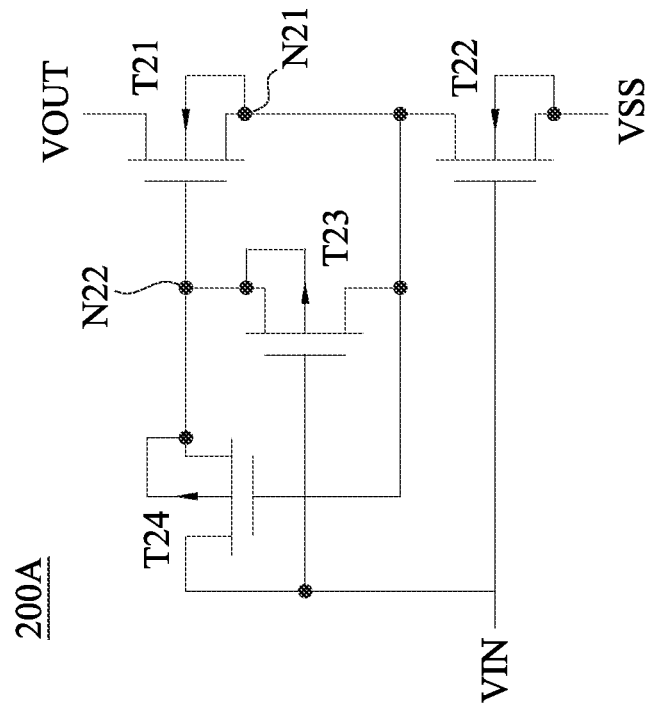
FIG. 2A is a circuit diagram of a semiconductor device corresponding to the semiconductor device shown in FIG. 1A, in accordance with some embodiments of the present disclosure.

FIG. 2A is a circuit diagram of a semiconductor device 200A corresponding to the semiconductor device 100A shown in FIG. 1A, in accordance with some embodiments of the present disclosure. In some embodiments, the semiconductor device 200A includes multiple transistors. As illustratively shown in FIG. 2A, the semiconductor device 200A includes transistors T21-T24. Referring to FIG. 1A and FIG. 2A, the transistors T21 and T22 correspond to the transistors T11 and T12, respectively.

In some embodiments, each of the transistors T21-T24 has a gate terminal, a source terminal, a drain terminal and a back gate terminal. As illustratively shown in FIG. 2A, the drain terminal of the transistor T21 is configured to output an output voltage signal VOUT. Each of the source terminal of the transistor T21, the back gate terminal of the transistor T21, the drain terminals of the transistors T22, T23 and the gate terminal of the transistor T24 is coupled to a node N21.

As illustratively shown in FIG. 2A, each of the gate terminals of the transistors T22, T23 and the drain terminal of the transistor T24 is configured to receive the input voltage signal VIN. Each of the source terminals of the transistor T24, T23, the back gate terminals of the transistors T24, T23 and the gate terminal of the transistor T21 is coupled to a node N22. Each of the source terminal of the transistor T22 and the back gate terminal of the transistor T22 is configured to receive the reference voltage signal VSS.

In some embodiments, each of the transistors T21 and T22 corresponds to a first conductive type, and each of the transistors T23 and T24 corresponds to a second conductive type different from the first conductive type. For example, each of the transistors T21 and T22 is implemented by a N-type transistor, and each of the transistors T23 and T24 is implemented by a P-type transistor.

In some embodiments, the semiconductor device 200A is configured to adjust the output voltage signal VOUT based on the input voltage signal VIN. For example, in response to the input voltage signal VIN having the voltage level LSS, the transistor T22 is turned off, the transistor T23 is turned on, such that each of the nodes N21 and N22 has the voltage level LM. The transistor T24 is turned off according to the voltage level LM at the node N21. The transistor T21 is turned off according to the voltage level LM at the node N22, such that the output voltage signal VOUT has the voltage level LDD, and corresponds to a high impedance state.

For another example, in response to the input voltage signal VIN having the voltage level LDD, the transistor T22 is turned on to transmit the reference voltage signal VSS to the node N21, such that the node N21 has the voltage level LSS. The transistor T23 is turned off. The transistor T24 is turned on according to the voltage level LSS at the node N21, such that the node N22 receives the input voltage signal VIN through the transistor T24 and has the voltage level LDD. The transistor T21 is turned on according to the voltage level LDD at the node N22, such that the output voltage signal VOUT is pulled to the voltage level LSS through the transistor T21.

Figure 2B:
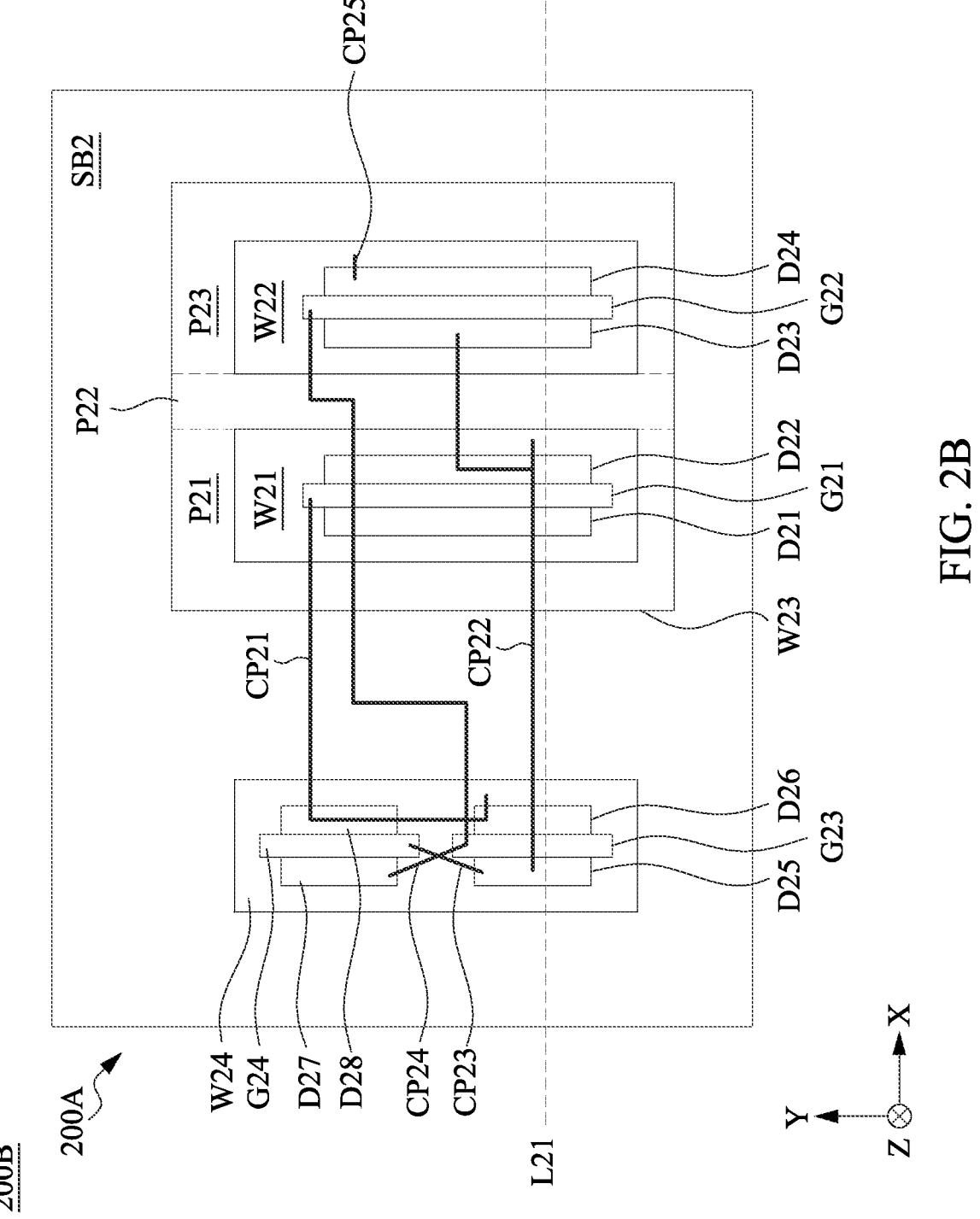
FIG. 2B is a layout diagram of the semiconductor device shown in FIG. 2A, in accordance with some embodiments of the present disclosure.

FIG. 2B is a layout diagram 200B of the semiconductor device 200A shown in FIG. 2A, in accordance with some embodiments of the present disclosure. Referring to FIG. 2A and FIG. 2B, the layout diagram 200B illustrates a structure of the semiconductor device 200A. In some embodiments, the semiconductor device 200A includes wells, gate structures and doped regions for forming the transistors T21-T24.

As illustratively shown in FIG. 2B, the semiconductor device 200A includes a substrate SB2, wells W21-W24, gate structures G21-G24 and dope regions D21-D28. Each of the gate structures G21-G24 and the dope regions D21-D28 extends along the Y-direction. The wells W24, W21 and W22 are arranged in order along a X-direction. The Z-direction points out from the paper.

As illustratively shown in FIG. 2B, the wells W23 and W24 are disposed in the substrate SB2. The well W23 includes portions P21-P23 arranged in order along the X-direction. The well W21 is disposed on the portion P21. The well W22 is disposed on the portion P23. The portion P22 is formed between the wells W21 and W22, to separate the wells W21 and W22 from each other.

As illustratively shown in FIG. 2B, each of the doped regions D21 and D22 is disposed in the well W21. Each of the doped regions D23 and D24 is disposed in the well W22. Each of the doped regions D25-D28 is disposed in the well W24. The gate structure G21 is disposed between the doped regions D21 and D22. The gate structure G22 is disposed between the doped regions D23 and D24. The gate structure G23 is disposed between the doped regions D25 and D26. The gate structure G24 is disposed between the doped regions D27 and D28.

As illustratively shown in FIG. 2B, the gate structure G21 is coupled to the doped regions D26, D28 and the well W24 through a conductive path CP21. The doped region D22 and the well W21 are coupled to the doped regions D23 and D25 through a conductive path CP22. The doped region D25 is coupled to the gate structure G24 through a conductive path CP23. The gate structure G23 is coupled to the doped region D27 and the gate structure G22 through a conductive path CP24. The doped region D24 is coupled to the well W22 through a conductive path CP25. In some embodiments, the conductive paths CP21-CP25 are implemented by conductive segments, vias and/or contacts between the elements shown in FIG. 2B.

Referring to FIG. 2B and FIG. 2A, the wells W21 and W22 correspond to the back gate terminals of the transistors T21 and T22, respectively. The well W24 corresponds to the back gate terminals of the transistors T23 and T24. The gate structures G21-G24 correspond to the gate terminals of the transistors T21-T24, respectively. The dope regions D21-D28 correspond to the drain terminal of the transistor T21, the source terminal of the transistor T21, the drain terminal of the transistor T22, the source terminal of the transistor T22, the drain terminal of the transistor T23, the source terminal of the transistor T23, the drain terminal of the transistor T24 and the source terminal of the transistor T24, respectively. The conductive path CP21 corresponds to the node N22. The conductive paths CP22 and CP23 corresponds to the node N21.

Figure 2C:
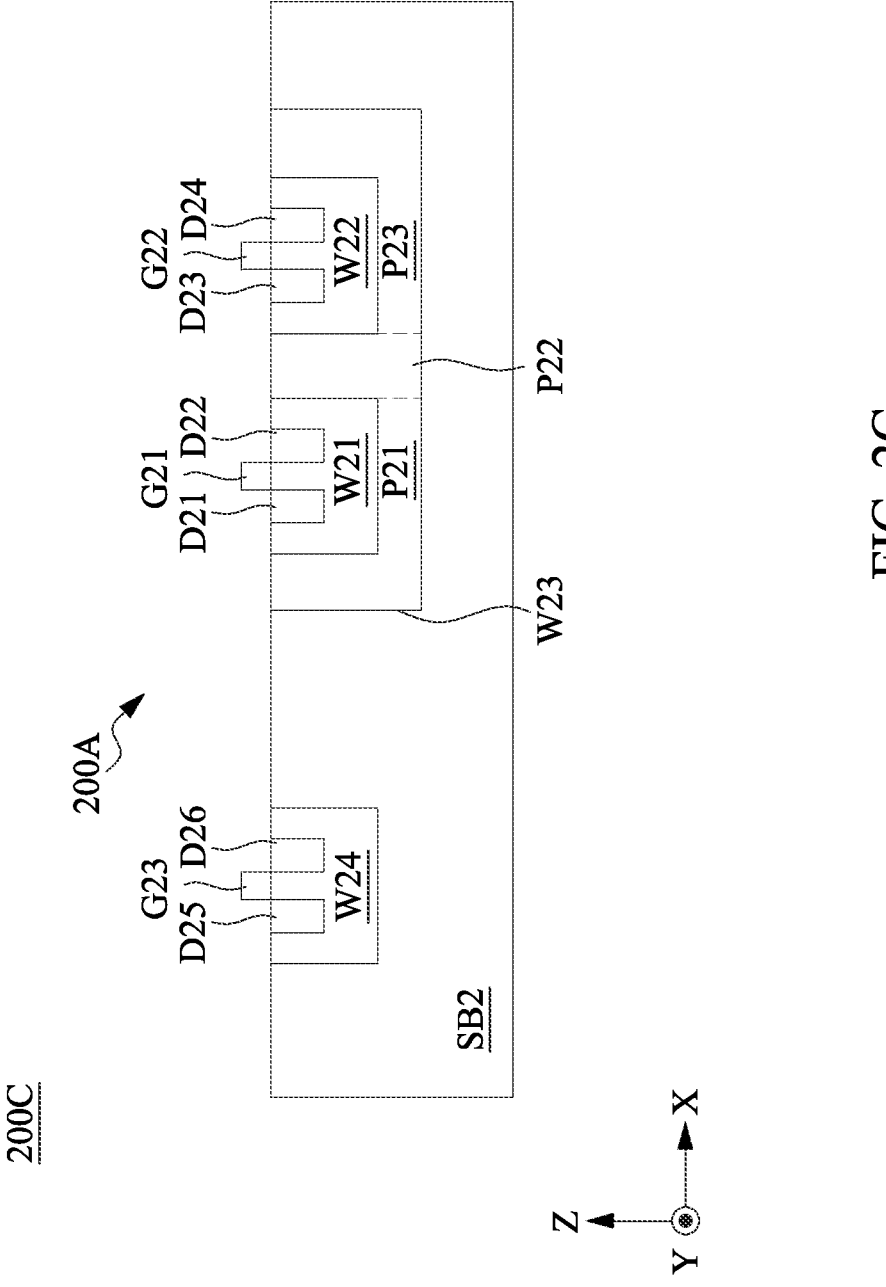
FIG. 2C is a cross section diagram of the semiconductor device along a line shown in FIG. 2B, in accordance with some embodiments of the present disclosure.

FIG. 2C is a cross section diagram 200C of the semiconductor device 200A along a line L21 shown in FIG. 2B, in accordance with some embodiments of the present disclosure. As illustratively shown in FIG. 2C, the Y-direction points into the paper. The portion P22 is interposed between the wells W21 and W22, to separate the wells W21 and W22 from each other.

In some embodiments, the well W23 is configured to receive the reference voltage signal VDD. Each of the gate structures G21, G23 and the doped region D27 is configured to receive the input voltage signal VIN. The well W24 is configured to be floated. Each of the well W22 and the doped region D24 is configured to receive the reference voltage signal VSS.

In some embodiments, each of the doped regions D21-D24 and the wells W23, W24 corresponds to the first conductive type, and each of the substrate SB2, the doped regions D25-D28 and the wells W21, W22 corresponds to the second conductive type. For example, each of the doped regions D21-D24 and the wells W23, W24 is implemented by N-type materials, and each of the substrate SB2, the doped regions D25-D28 and the wells W21, W22 is implemented by P-type materials.

Figure 2D:
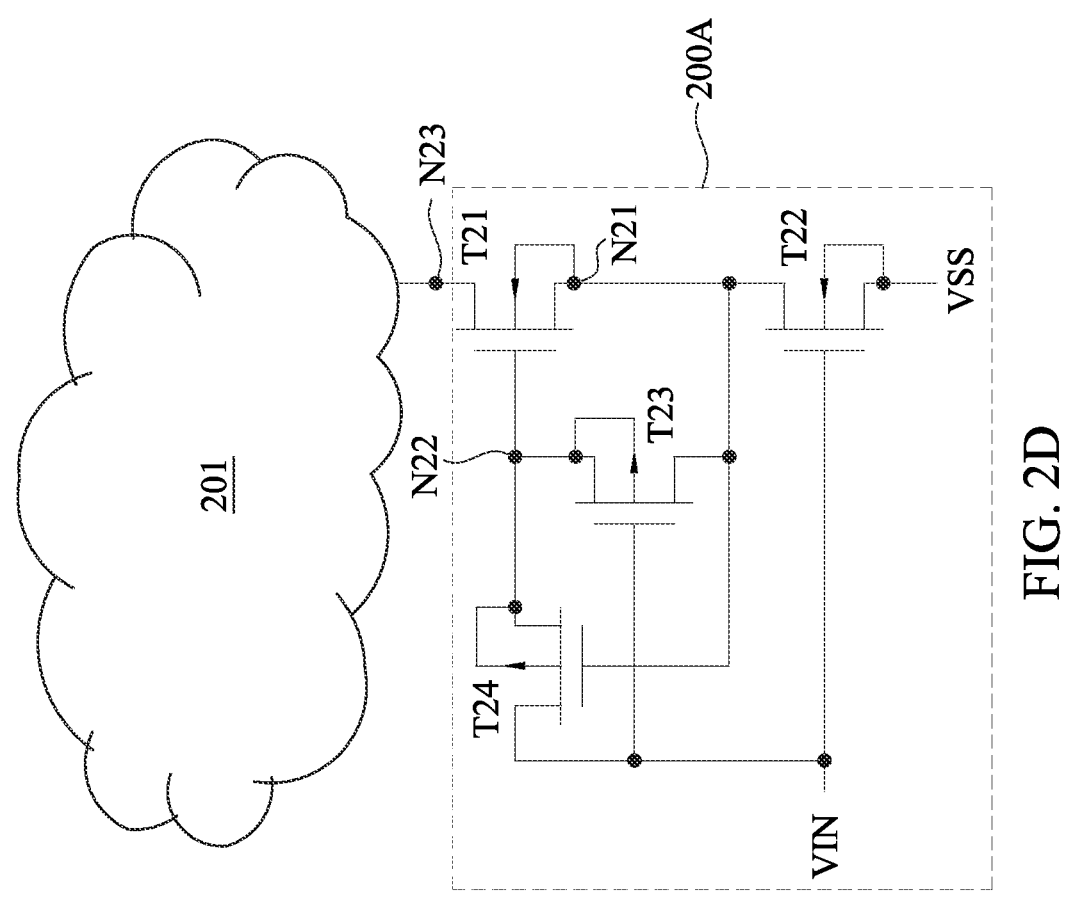
FIG. 2D is a schematic diagram of a semiconductor system corresponding to the semiconductor device shown in FIG. 2A, in accordance with some embodiments of the present disclosure.

FIG. 2D is a schematic diagram of a semiconductor system 200D corresponding to the semiconductor device 200A shown in FIG. 2A, in accordance with some embodiments of the present disclosure.

As illustratively shown in FIG. 2D, the semiconductor system 200D includes the semiconductor device 200A and a semiconductor device group 201. In some embodiments, the semiconductor device group 201 includes at least a part of logic devices, memory devices and analog devices and is configured to receive the reference voltage signal VDD.

As illustratively shown in FIG. 2D, the semiconductor device 200A is coupled to the semiconductor device group 201 at a node N23. In some embodiments, the semiconductor device 200A is configured to operate as a power switch of the semiconductor device group 201. Details of the semiconductor device 200A are described above in the embodiments associated with FIG. 2A. Therefore, some descriptions are not repeated for brevity.

For example, in response to the input voltage signal VIN having the voltage level LDD, the semiconductor device 200A is configured to provide the virtual reference voltage signal VSS to the node N23, to power the semiconductor device group 201. In response to the input voltage signal VIN having the voltage level LSS, the semiconductor device 200A has the high impedance state and does not provide the virtual reference voltage signal VSS to the semiconductor device group 201.

Figure 3A:
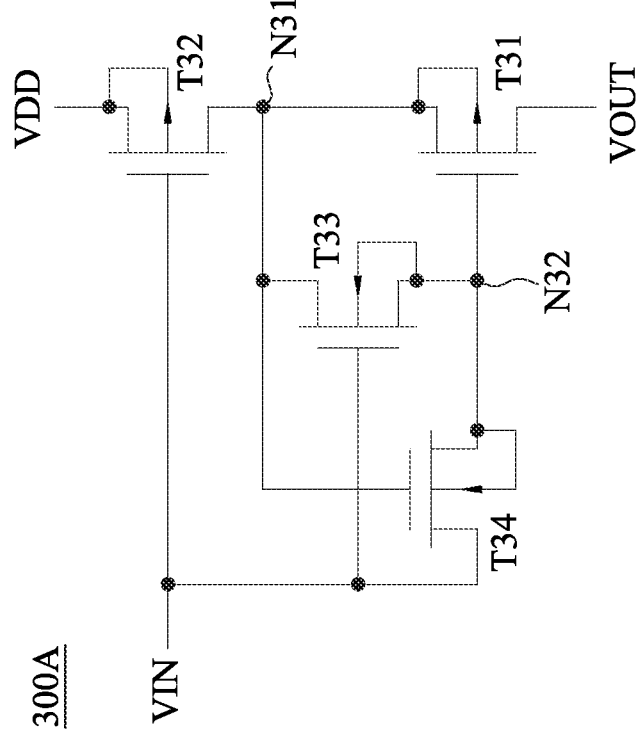
FIG. 3A is a circuit diagram of a semiconductor device corresponding to the semiconductor device shown in FIG. 1A, in accordance with some embodiments of the present disclosure.

FIG. 3A is a circuit diagram of a semiconductor device 300A corresponding to the semiconductor device 100A shown in FIG. 1A, in accordance with some embodiments of the present disclosure. In some embodiments, the semiconductor device 300A includes multiple transistors. As illustratively shown in FIG. 3A, the semiconductor device 300A includes transistors T31-T34. Referring to FIG. 1A and FIG. 3A, the transistors T31 and T32 correspond to the transistors T11 and T12, respectively.

In some embodiments, each of the transistors T31-T34 has a gate terminal, a source terminal, a drain terminal and a back gate terminal. As illustratively shown in FIG. 3A, the drain terminal of the transistor T31 is configured to output an output voltage signal VOUT. Each of the source terminal of the transistor T31, the back gate terminal of the transistor T31, the drain terminals of the transistors T32, T33 and the gate terminal of the transistor T34 is coupled to a node N31.

As illustratively shown in FIG. 3A, each of the gate terminals of the transistors T32, T33 and the drain terminal of the transistor T34 is configured to receive the input voltage signal VIN. Each of the source terminals of the transistor T34, T33, the back gate terminals of the transistors T34, T33 and the gate terminal of the transistor T31 is coupled to a node N32. Each of the source terminal of the transistor T32 and the back gate terminal of the transistor T32 is configured to receive the reference voltage signal VDD.

In some embodiments, each of the transistors T31 and T33 corresponds to the second conductive type, and each of the transistors T33 and T34 corresponds to the first conductive type. For example, each of the transistors T31 and T32 is implemented by a P-type transistor, and each of the transistors T33 and T34 is implemented by a N-type transistor.

In some embodiments, the semiconductor device 300A is configured to adjust the output voltage signal VOUT based on the input voltage signal VIN. For example, in response to the input voltage signal VIN having the voltage level LDD, the transistor T32 is turned off, the transistor T33 is turned on, such that each of the nodes N31 and N32 has the voltage level LM. The transistor T34 is turned off according to the voltage level LM at the node N31. The transistor T41 is turned off according to the voltage level LM at the node N32, such that the output voltage signal VOUT has the voltage level LSS, and corresponds to a high impedance state.

For another example, in response to the input voltage signal VIN having the voltage level LSS, the transistor T32 is turned on to transmit the reference voltage signal VDD to the node N31, such that the node N31 has the voltage level LDD. The transistor T33 is turned off. The transistor T34 is turned on according to the voltage level LDD at the node N31, such that the node N32 receives the input voltage signal VIN through the transistor T34 and has the voltage level LSS. The transistor T31 is turned on according to the voltage level LSS at the node N32, such that the output voltage signal VOUT is pulled to the voltage level LDD through the transistor T31.

Figure 3B:
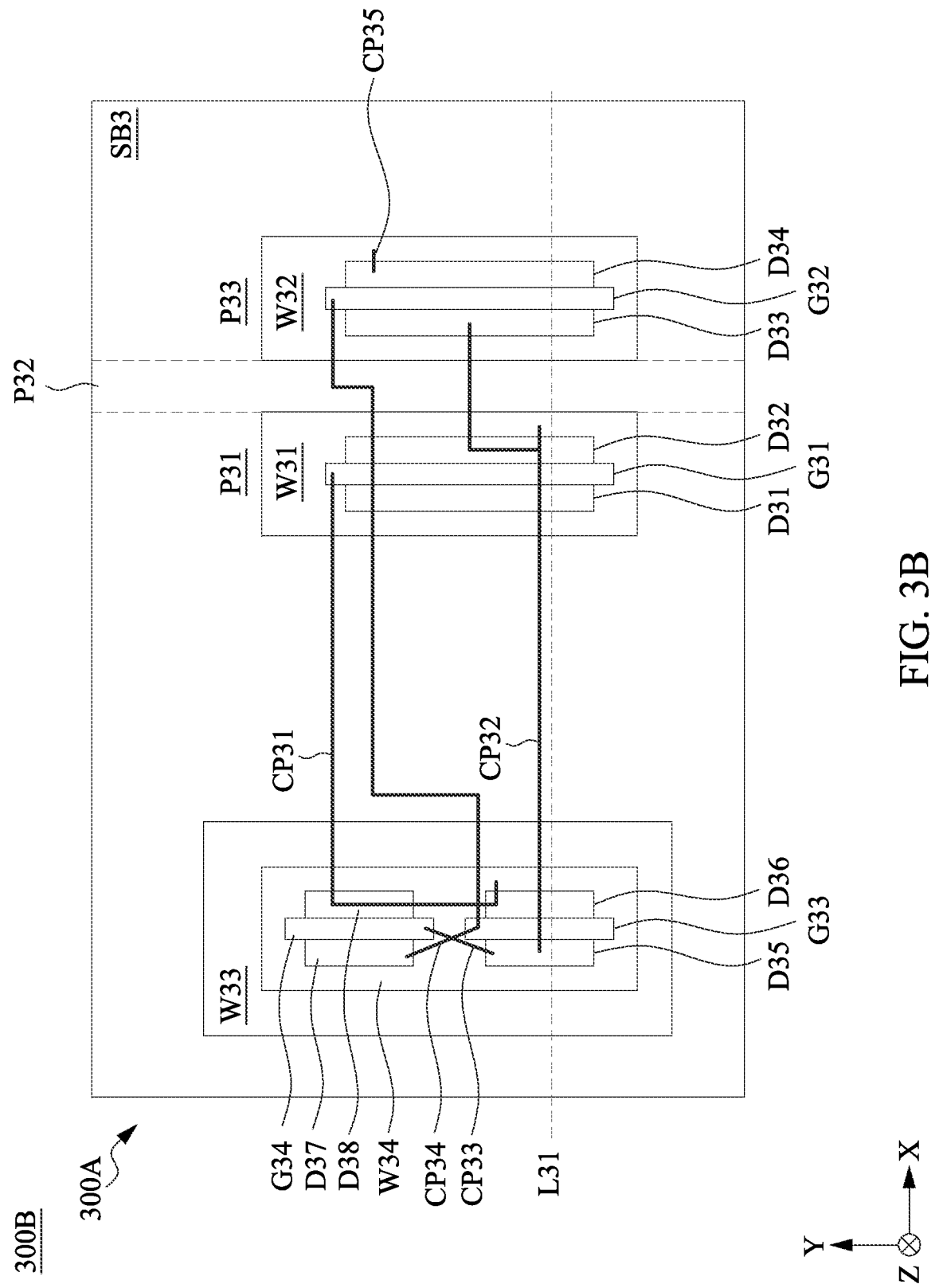
FIG. 3B is a layout diagram of the semiconductor device shown in FIG. 3A, in accordance with some embodiments of the present disclosure.

FIG. 3B is a layout diagram 300B of the semiconductor device 300A shown in FIG. 3A, in accordance with some embodiments of the present disclosure. Referring to FIG. 3A and FIG. 3B, the layout diagram 300B illustrates a structure of the semiconductor device 300A. In some embodiments, the semiconductor device 300A includes wells, gate structures and doped regions for forming the transistors T31-T34.

As illustratively shown in FIG. 3B, the semiconductor device 300A includes a substrate SB3, wells W31-W34, gate structures G31-G34 and dope regions D31-D38. Each of the gate structures G31-G34 and the dope regions D31-D38 extends along the Y-direction. The wells W33, W31 and W32 are arranged in order along a X-direction. The Z-direction points out from the paper.

As illustratively shown in FIG. 3B, the wells W33, W31 and W32 are disposed in the substrate SB3. The substrate SB3 includes portions P31-P33 arranged in order along the X-direction. The well W31 is disposed on the portion P31. The well W32 is disposed on the portion P33. The portion P32 is formed between the wells W31 and W32, to separate the wells W31 and W32 from each other. Referring to FIG. 1B and FIG. 3B, the substrate SB3 corresponds to the well W13.

As illustratively shown in FIG. 3B, the well W34 is disposed in the well W33. Each of the doped regions D31 and D32 is disposed in the well W31. Each of the doped regions D33 and D34 is disposed in the well W32. Each of the doped regions D35-D38 is disposed in the well W34. The gate structure G31 is disposed between the doped regions D31 and D32. The gate structure G32 is disposed between the doped regions D33 and D34. The gate structure G33 is disposed between the doped regions D35 and D36. The gate structure G34 is disposed between the doped regions D37 and D38.

As illustratively shown in FIG. 3B, the gate structure G31 is coupled to the doped regions D36, D38 and the well W34 through a conductive path CP31. The doped region D32 and the well W31 are coupled to the doped regions D33 and D35 through a conductive path CP32. The doped region D35 is coupled to the gate structure G34 through a conductive path CP33. The gate structure G33 is coupled to the doped region D37 and the gate structure G32 through a conductive path CP34. The doped region D34 is coupled to the well W32 through a conductive path CP35. In some embodiments, the conductive paths CP31-CP35 are implemented by conductive segments, vias and/or contacts between the elements shown in FIG. 3B.

Referring to FIG. 3B and FIG. 3A, the wells W31 and W32 correspond to the back gate terminals of the transistors T31 and T32, respectively. The well W34 corresponds to the back gate terminals of the transistors T33 and T34. The gate structures G31-G34 correspond to the gate terminals of the transistors T31-T34, respectively. The dope regions D31-D38 correspond to the drain terminal of the transistor T31, the source terminal of the transistor T31, the drain terminal of the transistor T32, the source terminal of the transistor T32, the drain terminal of the transistor T33, the source terminal of the transistor T33, the drain terminal of the transistor T34 and the source terminal of the transistor T34, respectively. The conductive path CP31 corresponds to the node N32. The conductive paths CP32 and CP33 corresponds to the node N31.

Figure 3C:
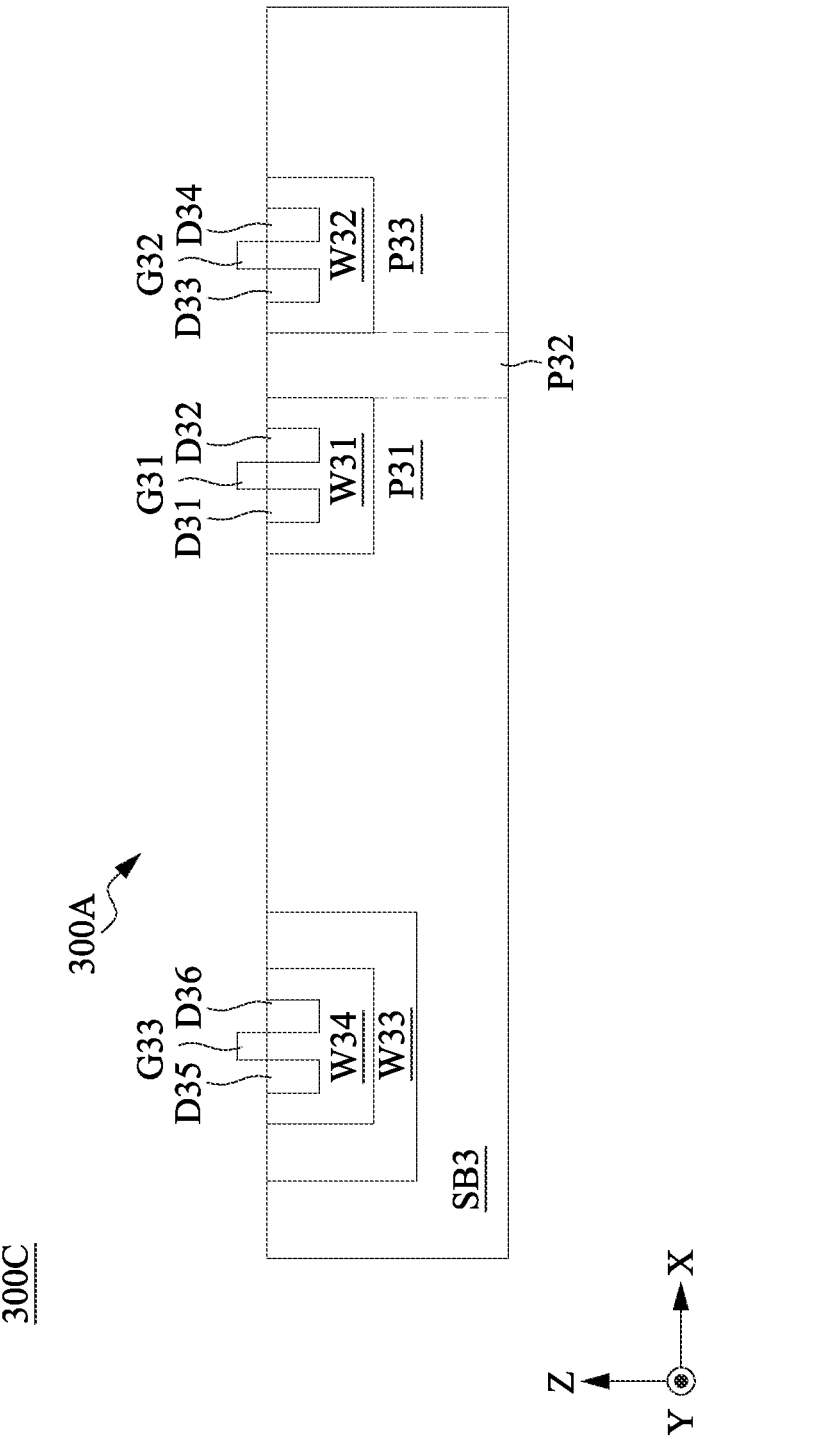
FIG. 3C is a cross section diagram of the semiconductor device along a line shown in FIG. 3B, in accordance with some embodiments of the present disclosure.

FIG. 3C is a cross section diagram 300C of the semiconductor device 300A along a line L31 shown in FIG. 3B, in accordance with some embodiments of the present disclosure. As illustratively shown in FIG. 3C, the Y-direction points into the paper. The portion P32 is interposed between the wells W31 and W32, to separate the wells W31 and W32 from each other.

In some embodiments, each of the wells W33, W32 and the doped region D34 is configured to receive the reference voltage signal VDD. Each of the gate structures G31, G33 and the doped region D37 is configured to receive the input voltage signal VIN. The well W34 is configured to be floated.

In some embodiments, each of the substrate SB3, the doped regions D31-D34 and the well W34 corresponds to the second conductive type, and each of the doped regions D35-D38 and the wells W31-W33 corresponds to the first conductive type. For example, each of the substrate SB3, the doped regions D31-D34 and the well W34 is implemented by P-type materials, and each of the doped regions D35-D38 and the wells W31-W33 is implemented by N-type materials.

Figure 3D:
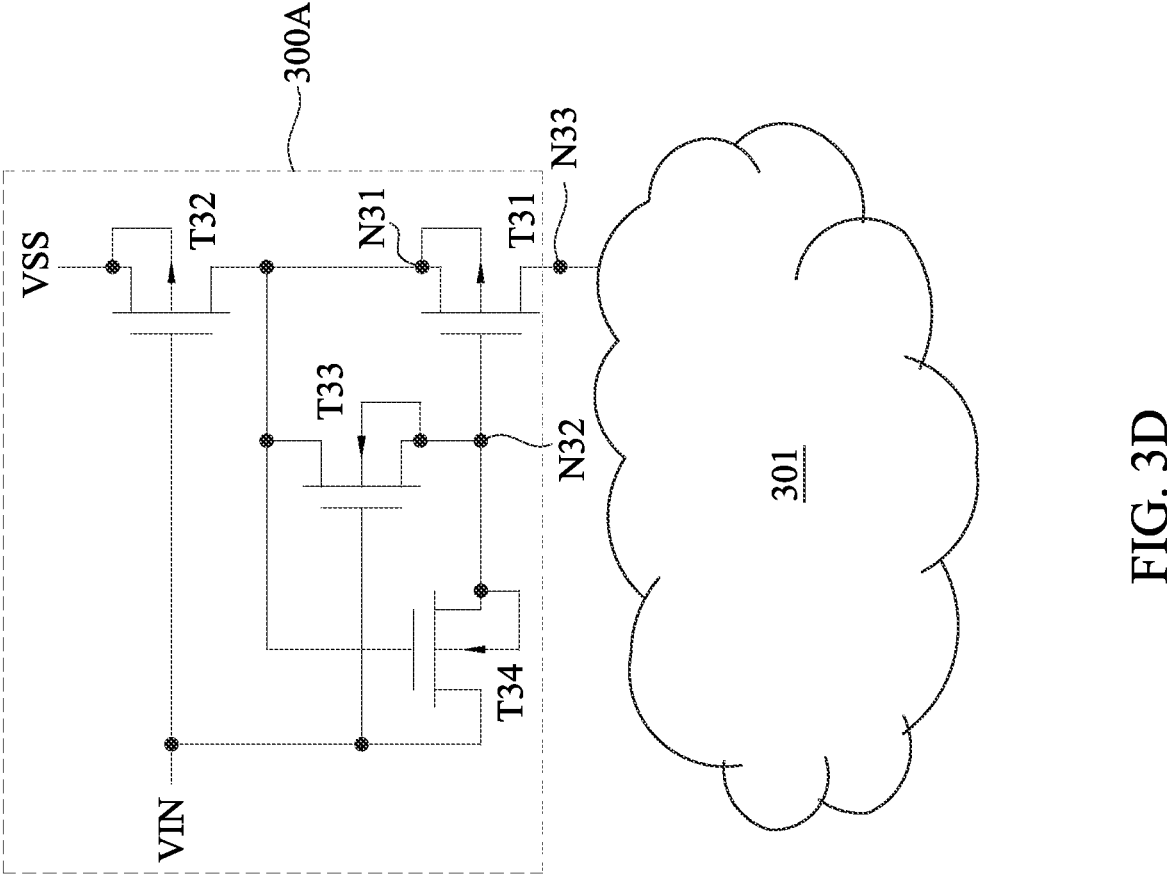
FIG. 3D is a schematic diagram of a semiconductor system corresponding to the semiconductor device shown in FIG. 3A, in accordance with some embodiments of the present disclosure.

FIG. 3D is a schematic diagram of a semiconductor system 300D corresponding to the semiconductor device 300A shown in FIG. 3A, in accordance with some embodiments of the present disclosure.

As illustratively shown in FIG. 3D, the semiconductor system 300D includes the semiconductor device 300A and a semiconductor device group 301. In some embodiments, the semiconductor device group 301 includes at least a part of logic devices, memory devices and analog devices and is configured to receive the reference voltage signal VSS.

As illustratively shown in FIG. 3D, the semiconductor device 300A is coupled to the semiconductor device group 301 at a node N33. In some embodiments, the semiconductor device 300A is configured to operate as a power switch of the semiconductor device group 301. Details of the semiconductor device 300A are described above in the embodiments associated with FIG. 3A. Therefore, some descriptions are not repeated for brevity.

For example, in response to the input voltage signal VIN having the voltage level LSS, the semiconductor device 300A is configured to provide the virtual reference voltage signal VDD to the node N33, to power the semiconductor device group 301. In response to the input voltage signal VIN having the voltage level LDD, the semiconductor device 300A has the high impedance state and does not provide the virtual reference voltage signal VDD to the semiconductor device group 301.

Figure 4:
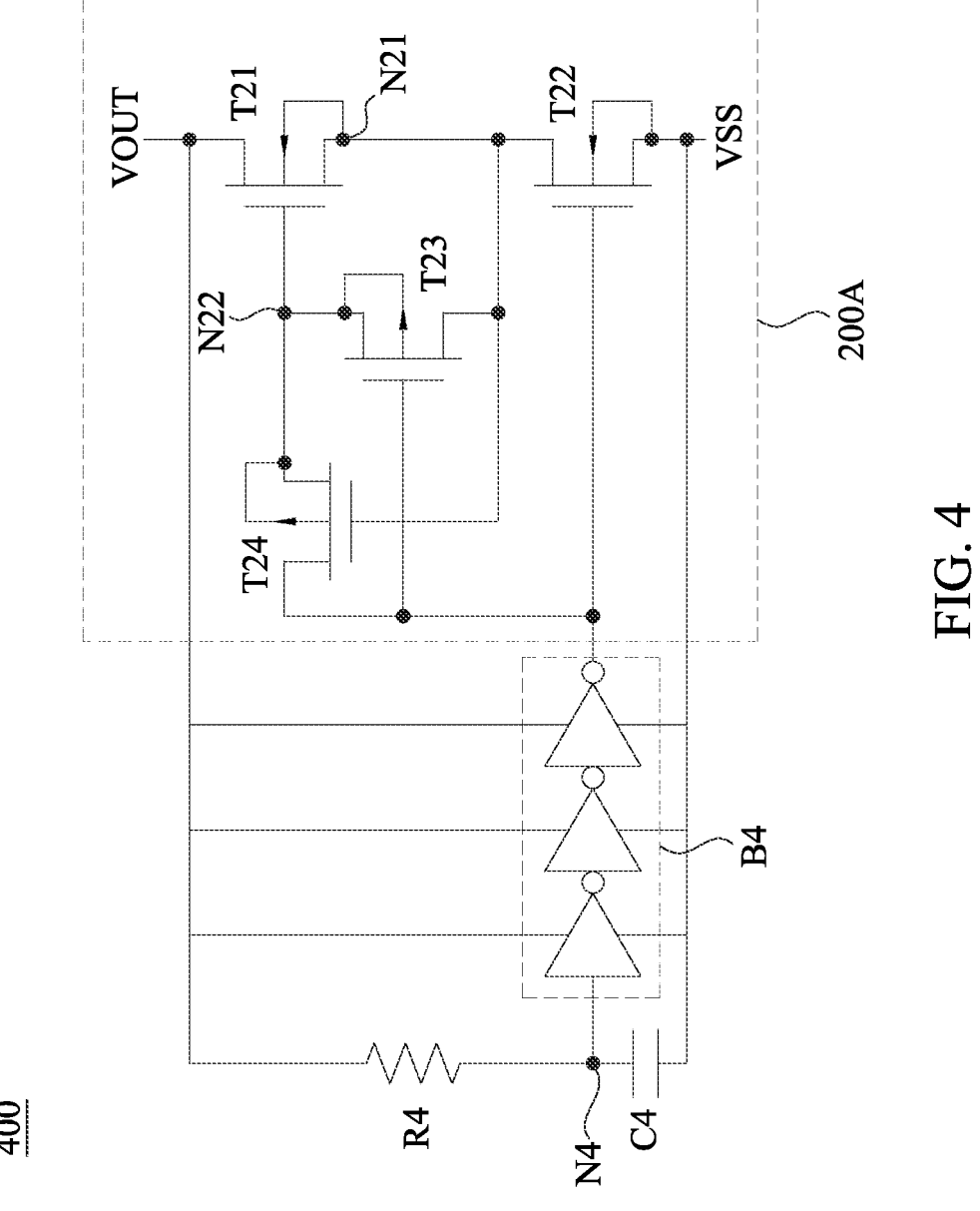
FIG. 4 is a circuit diagram of a semiconductor device corresponding to the semiconductor device shown in FIG. 2A, in accordance with some embodiments of the present disclosure.

FIG. 4 is a circuit diagram of a semiconductor device 400 corresponding to the semiconductor device 200A shown in FIG. 2A, in accordance with some embodiments of the present disclosure. In some embodiments, the semiconductor device 400 is configured to operate as an electro static discharge (ESD) protection circuit of a device receiving the reference voltage signals VDD and VSS.

As illustratively shown in FIG. 4, the semiconductor device 400 includes the semiconductor device 200A, a resistor R4, a capacitor C4 and buffers B4. Details of the semiconductor device 200A are described above in the embodiments associated with FIG. 2A. Therefore, some descriptions are not repeated for brevity.

As illustratively shown in FIG. 4, a first terminal of the resistor R4 is coupled to the drain terminal of the transistor T21, and a second terminal of the resistor R4 is coupled to a node N4. A first terminal of the capacitor C4 is coupled to the source terminal of the transistor T22, and a second terminal of the capacitor C4 is coupled to the node N4. The buffers B4 are coupled in series between the node N4 and the gate terminal of the transistor T22. First power terminals of the buffers B4 are coupled to the drain terminal of the transistor T21. Second power terminals of the buffers B4 are coupled to the source terminal of the transistor T22.

In alternative embodiments, the resistor R4, the capacitor C4 and the buffers B4 are coupled to the semiconductor device 300A shown in FIG. 3A instead of 200A. For example, the resistor R4 and the capacitor C4 are coupled in series between the drain terminal of the transistor T31 and the source terminal of the transistor T32, and are coupled to each other at a node. The buffers B4 are coupled in series between the node and the gate terminal of the transistor T32.

Figure 5:
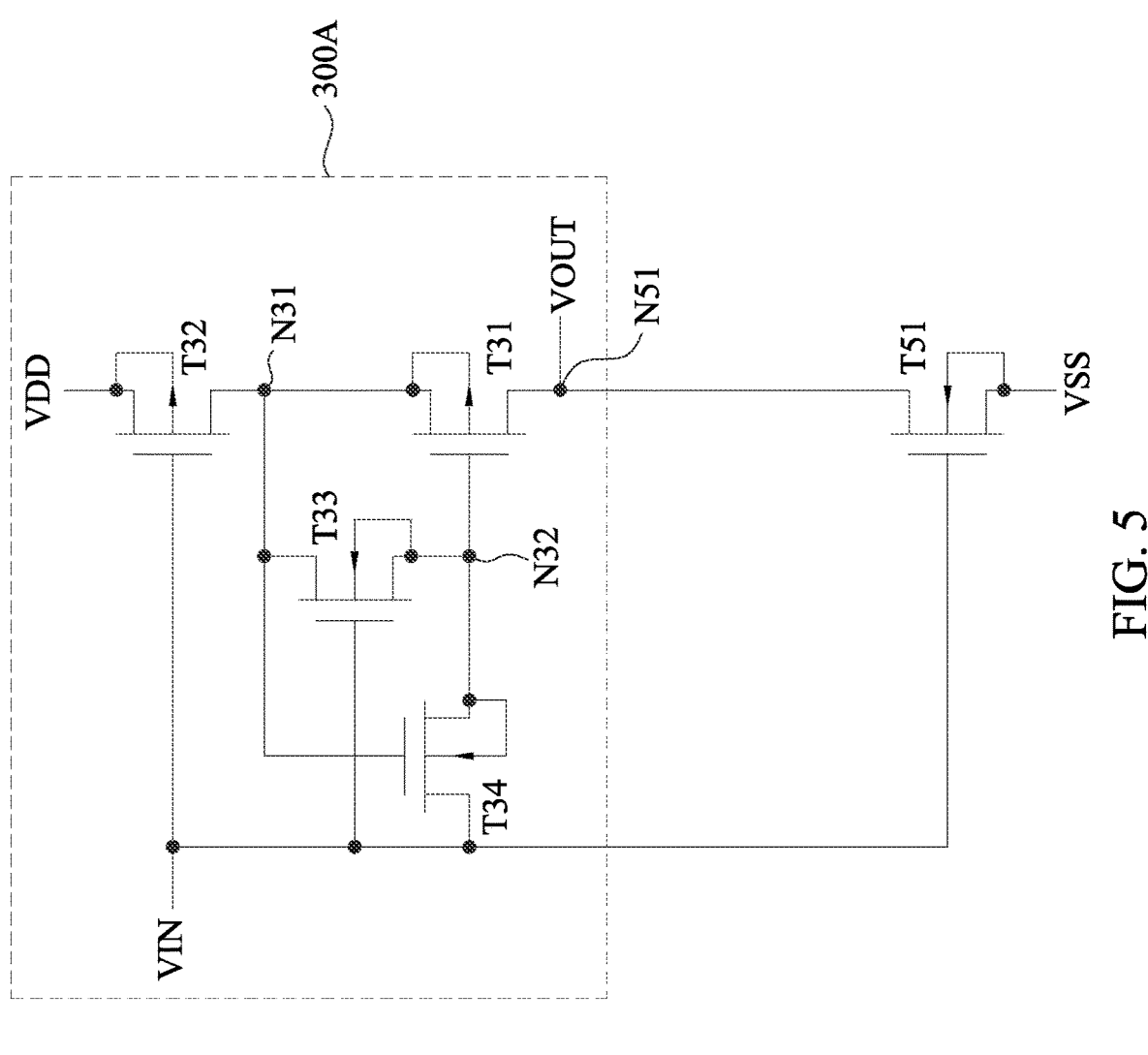
FIG. 5 is a circuit diagram of a semiconductor device corresponding to the semiconductor device shown in FIG. 3A, in accordance with some embodiments of the present disclosure.

FIG. 5 is a circuit diagram of a semiconductor device 500 corresponding to the semiconductor device 300A shown in FIG. 3A, in accordance with some embodiments of the present disclosure. In some embodiments, the semiconductor device 500 is configured to operate as an inverter gate.

As illustratively shown in FIG. 5, the semiconductor device 500 includes the semiconductor device 300A and a transistor T51. Details of the semiconductor device 300A are described above in the embodiments associated with FIG. 3A. Therefore, some descriptions are not repeated for brevity.

As illustratively shown in FIG. 5, each of a source terminal of the transistor T51 and a back gate terminal of the transistor T51 is configured to receive the reference voltage signal VSS, a drain terminal of the transistor T51 is coupled to a drain terminal of the transistor T31 at a node N51, and a gate terminal of the transistor T51 is configured to receive the input voltage signal VIN. In some embodiments, the transistor T51 is implemented by a N-type transistor.

In some embodiments, in response to the input voltage signal VIN having the voltage level LDD, the transistor T32 is turned off, and the transistor T51 is turned on to provide the reference voltage signal VSS to the node N51, such that the output voltage signal VOUT has the voltage level LSS. In response to the input voltage signal VIN having the voltage level LSS, the transistor T51 is turned off, and the transistors T31 and T32 are turned on to provide the reference voltage signal VDD to the node N51, such that the output voltage signal VOUT has the voltage level LDD.

Figure 6:
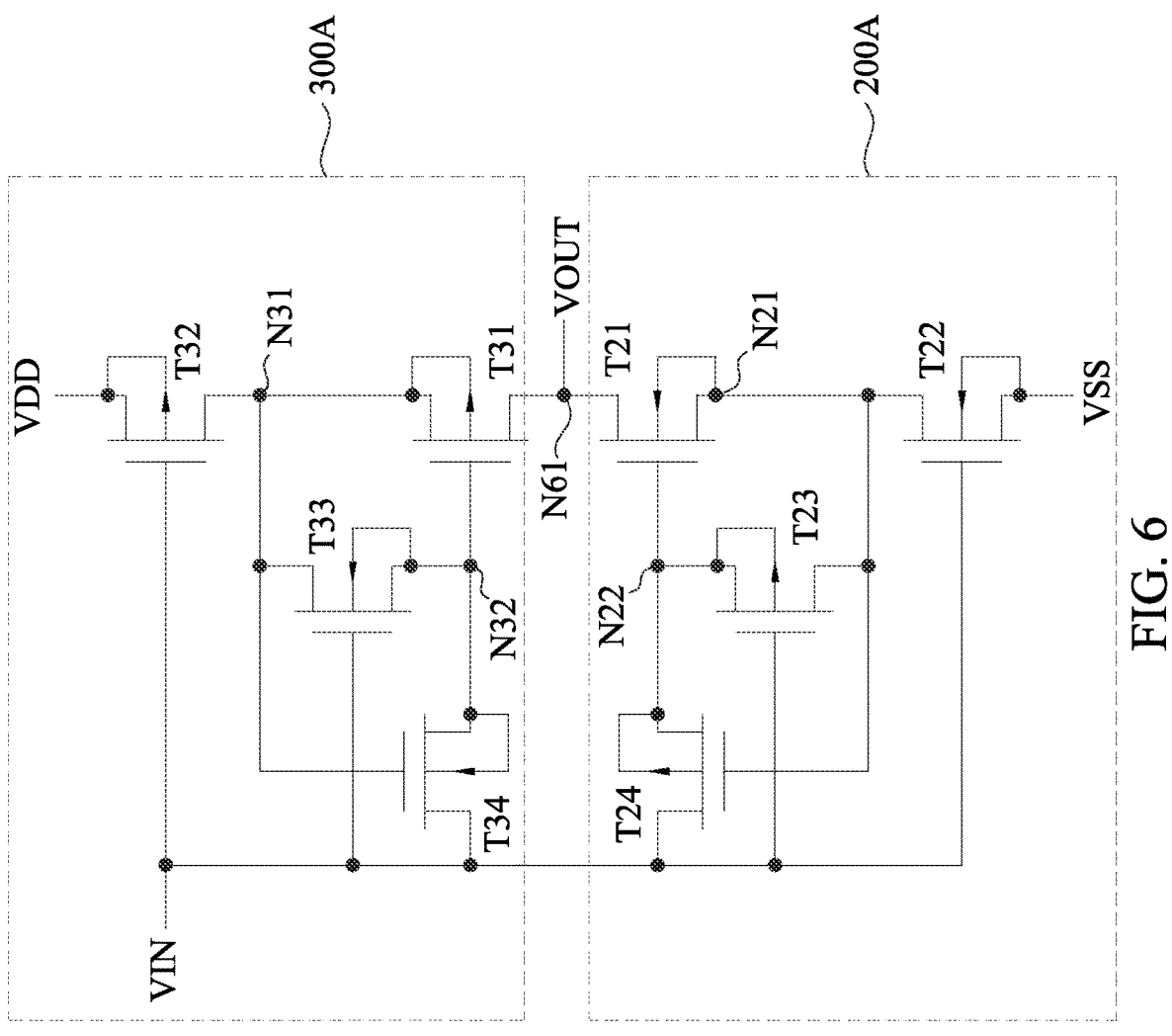
FIG. 6 is a circuit diagram of a semiconductor device corresponding to the semiconductor device shown in FIG. 2A and the semiconductor device shown in FIG. 3A, in accordance with some embodiments of the present disclosure.

FIG. 6 is a circuit diagram of a semiconductor device 600 corresponding to the semiconductor device 200A shown in FIG. 2A and the semiconductor device 300A shown in FIG. 3A, in accordance with some embodiments of the present disclosure. In some embodiments, the semiconductor device 600 is configured to operate as an inverter gate.

As illustratively shown in FIG. 6, the semiconductor device 600 includes the semiconductor devices 300A and 200A. Details of the semiconductor devices 300A and 200A are described above in the embodiments associated with FIG. 2A and FIG. 3A. Therefore, some descriptions are not repeated for brevity.

As illustratively shown in FIG. 5, the drain terminals of the transistors T31 and T21 are coupled to each other at a node N61. The gate terminals of the transistors T32 and T22 are configured to receive the input voltage signal VIN.

In some embodiments, in response to the input voltage signal VIN having the voltage level LDD, the transistors T32 and T31 are turned off, and the transistors T21 and T22 are turned on to provide the reference voltage signal VSS to the node N61, such that the output voltage signal VOUT has the voltage level LSS. In response to the input voltage signal VIN having the voltage level LSS, the transistors T21 and T22 are turned off, and the transistors T31 and T32 are turned on to provide the reference voltage signal VDD to the node N61, such that the output voltage signal VOUT has the voltage level LDD.

Figure 7B:
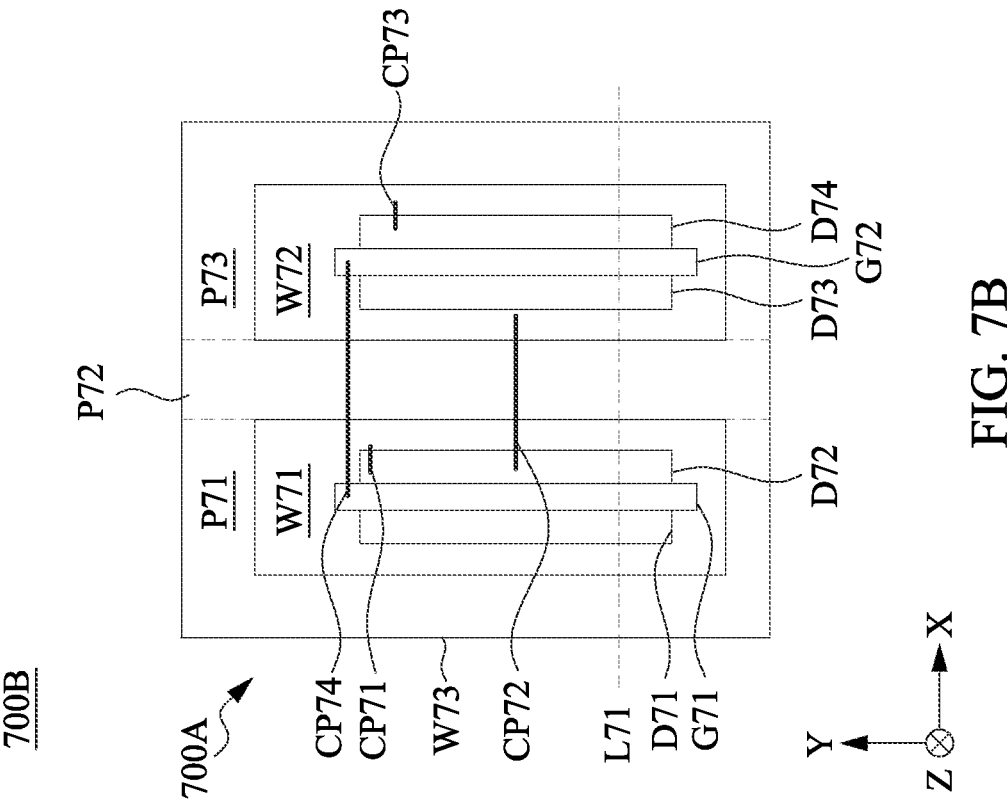
FIG. 7B is a layout diagram of the semiconductor device shown in FIG. 7A, in accordance with some embodiments of the present disclosure.
Figure 7A:
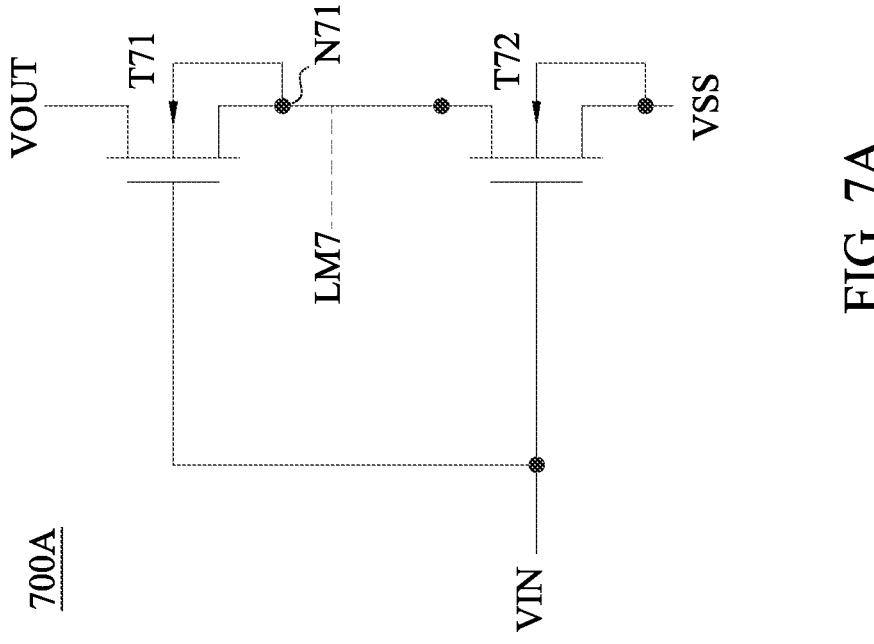
FIG. 7A is a circuit diagram of a semiconductor device corresponding to the semiconductor device shown in FIG. 1A, in accordance with some embodiments of the present disclosure.

FIG. 7A is a circuit diagram of a semiconductor device 700A corresponding to the semiconductor device 100A shown in FIG. 1A, in accordance with some embodiments of the present disclosure. Referring to FIG. 1A and FIG. 7A, the semiconductor device 700A is an alternative embodiment of the semiconductor device 100A.

In some embodiments, the semiconductor device 700A includes multiple transistors. As illustratively shown in FIG. 7A, the semiconductor device 700A includes transistors T71 and T72. In some embodiments, each of the transistors T71 and T72 has a gate terminal, a source terminal, a drain terminal and a back gate terminal.

As illustratively shown in FIG. 7A, the drain terminal of the transistor T71 is configured to output the output voltage signal VOUT. Each of the source terminal of the transistor T71 and the back gate terminal of the transistor T71 is coupled to the node N71. Each of the source terminal of the transistor T72 and the back gate terminal of the transistor T72 is configured to receive the reference voltage signal VSS. The drain terminal of the transistor T72 is coupled to the node N71. Each of the gate terminal of the transistor T72 and the gate terminal of the transistor T71 is configured to receive the input voltage signal VIN.

In the embodiment shown in FIG. 7A, the output voltage signal VOUT and the reference voltage signal VSS have voltage levels LDD and LSS, respectively. The input voltage signal VIN has the voltage level LSS. The node N71 has a voltage level LM7 between the voltage levels LDD and LSS. In some embodiments, the voltage level LM7 is larger than a half of the voltage level LDD.

FIG. 7B is a layout diagram 700B of the semiconductor device 700A shown in FIG. 7A, in accordance with some embodiments of the present disclosure. Referring to FIG. 7A and FIG. 7B, the layout diagram 700B illustrates a structure of the semiconductor device 700A. In some embodiments, the semiconductor device 700A includes wells, gate structures and doped regions for forming the transistors T71 and T72.

As illustratively shown in FIG. 7B, the semiconductor device 700A includes wells W71-W73, gate structures G71, G72 and dope regions D71-D74. Each of the gate structures G71, G72 and the dope regions D71-D74 extends along the Y-direction. The dope region D71, the gate structure G71, the dope regions D72-D73, the gate structure G72 and the dope region D74 are arranged in order along the X-direction. The Z-direction points out from the paper.

As illustratively shown in FIG. 7B, the well W73 includes portions P71-P73 arranged in order along the X-direction. The well W71 is disposed on the portion P71. The well W72 is disposed on the portion P73. The portion P72 is formed between the wells W71 and W72, to separate the wells W71 and W72 from each other.

As illustratively shown in FIG. 7B, each of the doped regions D71 and D72 is disposed in the well W71. Each of the doped regions D73 and D74 is disposed in the well W72. The gate structure G71 is disposed between the doped regions D71 and D72. The gate structure G72 is disposed between the doped regions D73 and D74.

As illustratively shown in FIG. 7B, the doped region D72 is coupled to the well W71 through a conductive path CP71. The doped region D72 and the well W71 are coupled to the doped region D73 through a conductive path CP72. The doped region D74 is coupled to the well W72 through a conductive path CP73. The gate structures G71 and G72 are coupled to each other through a conductive path CP74. In some embodiments, the conductive paths CP71-CP73 are implemented by conductive segments, vias and/or contacts between the elements shown in FIG. 7B.

Referring to FIG. 7B and FIG. 7A, the wells W71 and W72 correspond to the back gate terminals of the transistors T71 and T72, respectively. The gate structures G71 and G72 correspond to the gate terminals of the transistors T71 and T72, respectively. The dope regions D71-D74 correspond to the drain terminal of the transistor T71, the source terminal of the transistor T71, the drain terminal of the transistor T72 and the source terminal of the transistor T72, respectively. The conductive paths CP71-CP72 correspond to the node N71.

Figure 7C:
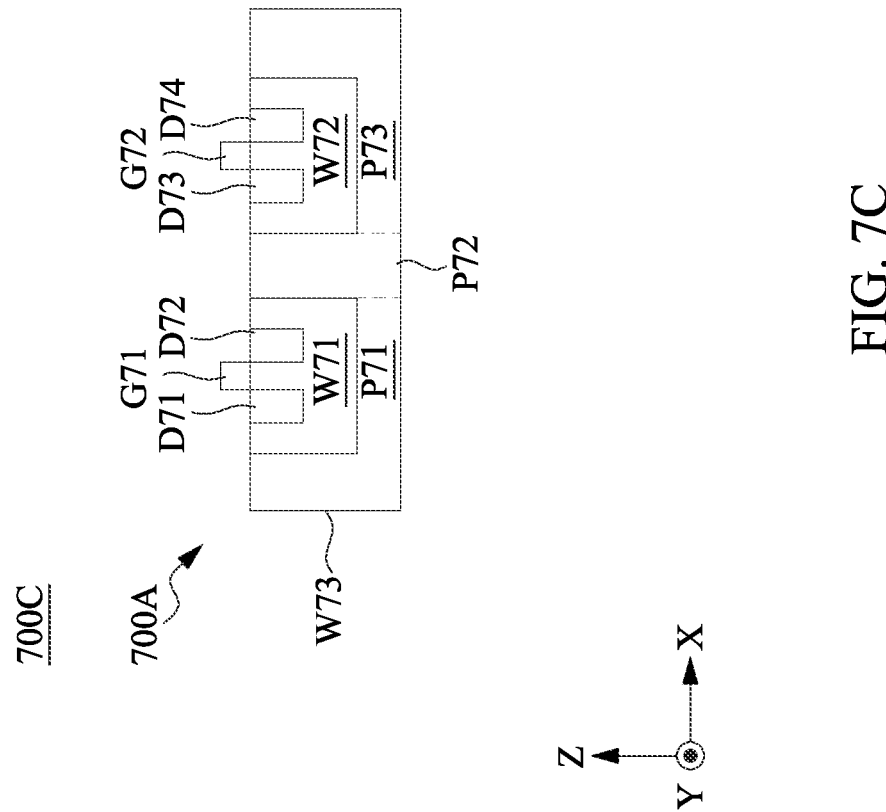
FIG. 7C is a cross section diagram of the semiconductor device along a line shown in FIG. 7B, in accordance with some embodiments of the present disclosure.

FIG. 7C is a cross section diagram 700C of the semiconductor device 700A along a line L71 shown in FIG. 7B, in accordance with some embodiments of the present disclosure. As illustratively shown in FIG. 7C, the Y-direction points into the paper. The portion P72 is interposed between the wells W71 and W72, to separate the wells W71 and W72 from each other.

In some embodiments, the well W73 is configured to receive the reference voltage signal VDD. Each of the well W71 and the doped regions D72, D73 has the voltage level LM7. Each of the gate structure G71 and G72 is configured to receive the input voltage signal VIN. Each of the well W72 and the doped region D74 is configured to receive the reference voltage signal VSS.

In some embodiments, each of the doped regions D71-D74 and the well W73 corresponds to the first conductive type, and each of the wells W71 and W72 corresponds to the second conductive type. For example, each of the doped regions D71-D74 and the well W73 is implemented by N-type materials, and each of the wells W71 and W72 is implemented by P-type materials.

Figure 8A:
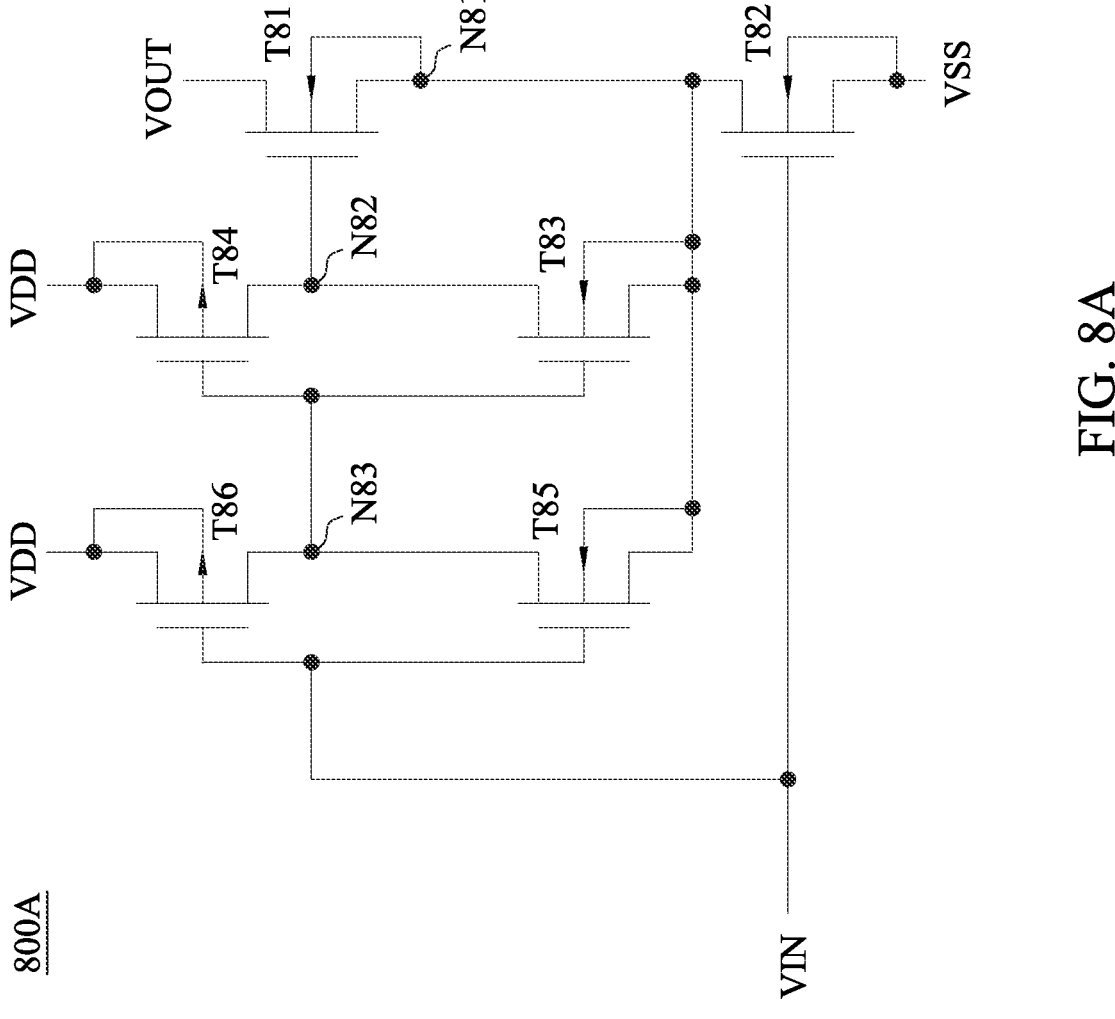
FIG. 8A is a circuit diagram of a semiconductor device corresponding to the semiconductor device shown in FIG. 1A, in accordance with some embodiments of the present disclosure.

FIG. 8A is a circuit diagram of a semiconductor device 800A corresponding to the semiconductor device 100A shown in FIG. 1A, in accordance with some embodiments of the present disclosure. In some embodiments, the semiconductor device 800A is configured to operate as an inverter type level down level shifter.

In some embodiments, the semiconductor device 800A includes multiple transistors. As illustratively shown in FIG. 8A, the semiconductor device 800A includes transistors T81-T86. In some embodiments, each of the transistors T81-T86 has a gate terminal, a source terminal, a drain terminal and a back gate terminal. Referring to FIG. 1A and FIG. 8A, the transistors T81 and T82 correspond to the transistors T11 and T12, respectively.

As illustratively shown in FIG. 8A, the drain terminal of the transistor T81 is configured to output an output voltage signal VOUT. Each of the gate terminals of the transistors T82, T85 and T86 is configured to receive the input voltage signal VIN. Each of the source terminals of the transistors T84, T86 and the back gate terminals of the transistors T84, T86 is configured to receive the reference voltage signal VDD. Each of the source terminal of the transistor T82 and the back gate terminal of the transistor T82 is configured to receive the reference voltage signal VSS.

As illustratively shown in FIG. 8A, each of the source terminals of the transistors T81, T83, T85, the back gate terminals of the transistors T81, T83, T85 and the drain terminal of the transistor T82 is coupled to a node N81. Each of the drain terminals of the transistors T83, T84 and the gate terminal of the transistor T81 is coupled to a node N82. Each of the drain terminals of the transistors T85, T86 and the gate terminals of the transistors T83, T84 is coupled to a node N83.

In some embodiments, each of the transistors T81, T82, T83 and T85 corresponds to the first conductive type, and each of the transistors T84 and T86 corresponds to the second conductive type. For example, each of the transistors T81, T82, T83 and T85 is implemented by a N-type transistor, and each of the transistors T84 and T86 is implemented by a P-type transistor.

In some embodiments, the input voltage signal has the voltage level LSS, such that the transistor T82 and T85 are turned off, and the transistor T86 is turned on. The transistor T86 is configured to transmit the reference voltage signal VDD to the node N83, such that the transistor T83 is turned on and the transistor T84 is turned off according to the voltage level LDD at the node N83. Each of the nodes N81 and N82 has a voltage level LM8 between the voltage levels LSS and LDD. In some embodiments, the voltage level LM8 is larger than a half of the voltage level LDD.

In some embodiments, the transistors T83 and T84 are configured to operate as a first inverter. The nodes N82 and N83 correspond to an output terminal and an input terminal of the first inverter, respectively. The source terminals of the transistors T83 and T84 correspond to power terminals of the first inverter.

In some embodiments, the transistors T85 and T86 are configured to operate as a second inverter. The node N83 corresponds to an input terminal of the second inverter. The gate terminals of the transistors T85 and T86 correspond to an output terminal of the second inverter. The source terminals of the transistors T85 and T86 correspond to power terminals of the second inverter. In some embodiments, the first inverter and the second inverter are coupled in series between the gate terminal of the transistor T81 and the gate terminal of the transistor T82.

Figure 8B:
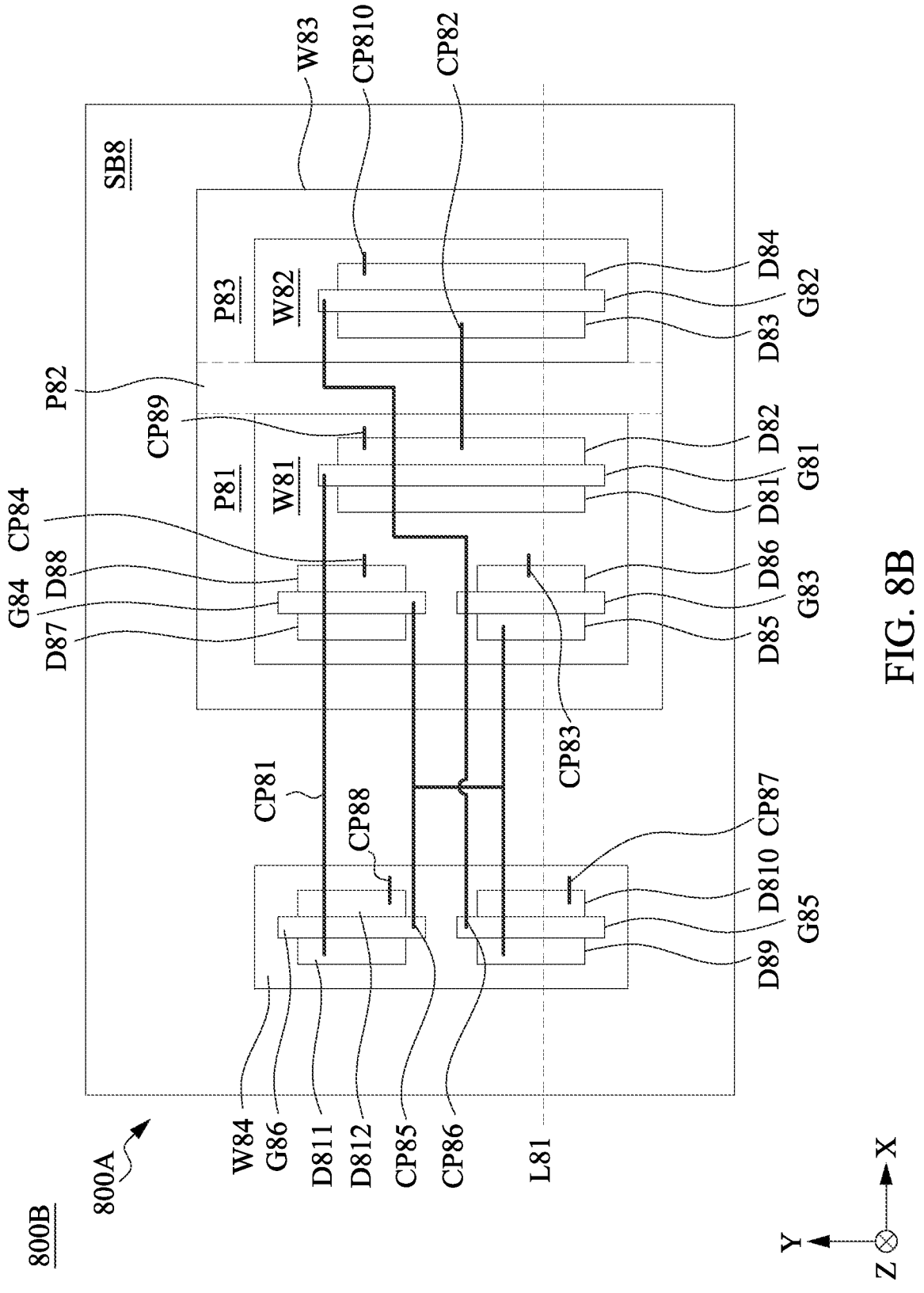
FIG. 8B is a layout diagram of the semiconductor device shown in FIG. 8A, in accordance with some embodiments of the present disclosure.

FIG. 8B is a layout diagram 800B of the semiconductor device 800A shown in FIG. 8A, in accordance with some embodiments of the present disclosure. Referring to FIG. 8A and FIG. 8B, the layout diagram 800B illustrates a structure of the semiconductor device 800A. In some embodiments, the semiconductor device 800A includes wells, gate structures and doped regions for forming the transistors T81-T86.

As illustratively shown in FIG. 8B, the semiconductor device 800A includes a substrate SB8, wells W81-W84, gate structures G81-G86 and dope regions D81-D812. Each of the gate structures G81-G86 and the dope regions D81-D812 extends along the Y-direction. The wells W84, W81 and W82 are arranged in order along a X-direction. The Z-direction points out from the paper.

As illustratively shown in FIG. 8B, the wells W84 and W83 are disposed in the substrate SB8. The well W83 includes portions P81-P83 arranged in order along the X-direction. The well W81 is disposed on the portion P81. The well W82 is disposed on the portion P83. The portion P82 is formed between the wells W81 and W82, to separate the wells W81 and W82 from each other.

As illustratively shown in FIG. 8B, each of the wells W81 and W82 is disposed in the well W83. Each of the doped regions D81, D82 and D85-D88 is disposed in the well W81. Each of the doped regions D83 and D84 is disposed in the well W82. Each of the doped regions D89-D812 is disposed in the well W84.

As illustratively shown in FIG. 8B, the gate structure G81 is disposed between the doped regions D81 and D82. The gate structure G82 is disposed between the doped regions D83 and D84. The gate structure G83 is disposed between the doped regions D85 and D86. The gate structure G84 is disposed between the doped regions D87 and D88. The gate structure G85 is disposed between the doped regions D89 and D810. The gate structure G86 is disposed between the doped regions D811 and D812.

As illustratively shown in FIG. 8B, the gate structure G81 is coupled to the doped regions D87 and D811 through a conductive path CP81. The doped region D82 is coupled to the doped region D83 through a conductive path CP82. The doped regions D86 and D88 are coupled to the well W81 through conductive paths CP83 and CP84, respectively. The gate structures G84 and G86 are coupled to the doped regions D85 and D89 through a conductive path CP85.

As illustratively shown in FIG. 8B, the gate structures G85, G83 and G82 are coupled to each other through a conductive path CP86. The doped regions D810 and D812 are coupled to the well W84 through conductive paths CP87 and CP88, respectively. The doped region D82 is coupled to the well W81 through a conductive path CP89. The doped region D84 is coupled to the well W82 through a conductive path CP810. In some embodiments, the conductive paths CP81-CP810 are implemented by conductive segments, vias and/or contacts between the elements shown in FIG. 8B.

Referring to FIG. 8B and FIG. 8A, the wells W81 corresponds to the back gate terminals of the transistors T81, T83 and T85. The well W84 corresponds to the back gate terminals of the transistors T86 and T84. The well W82 corresponds to the back gate terminal of the transistor T82. The gate structures G81-G86 correspond to the gate terminals of the transistors T81, T82, T85, T83, T86 and T84, respectively.

Referring to FIG. 8B and FIG. 8A, the dope regions D81-D812 correspond to the drain terminal of the transistor T81, the source terminal of the transistor T81, the drain terminal of the transistor T82, the source terminal of the transistor T82, the drain terminal of the transistor T85, the source terminal of the transistor T85, the drain terminal of the transistor T83, the source terminal of the transistor T83, the drain terminal of the transistor T86, the source terminal of the transistor T86, the drain terminal of the transistor T84 and the source terminal of the transistor T84, respectively.

Referring to FIG. 8B and FIG. 8A, the conductive path CP81 corresponds to the node N82. The conductive paths CP82, CP83, CP84 and CP89 correspond to the node N81. The conductive path CP85 corresponds to the node N83.

Figure 8C:
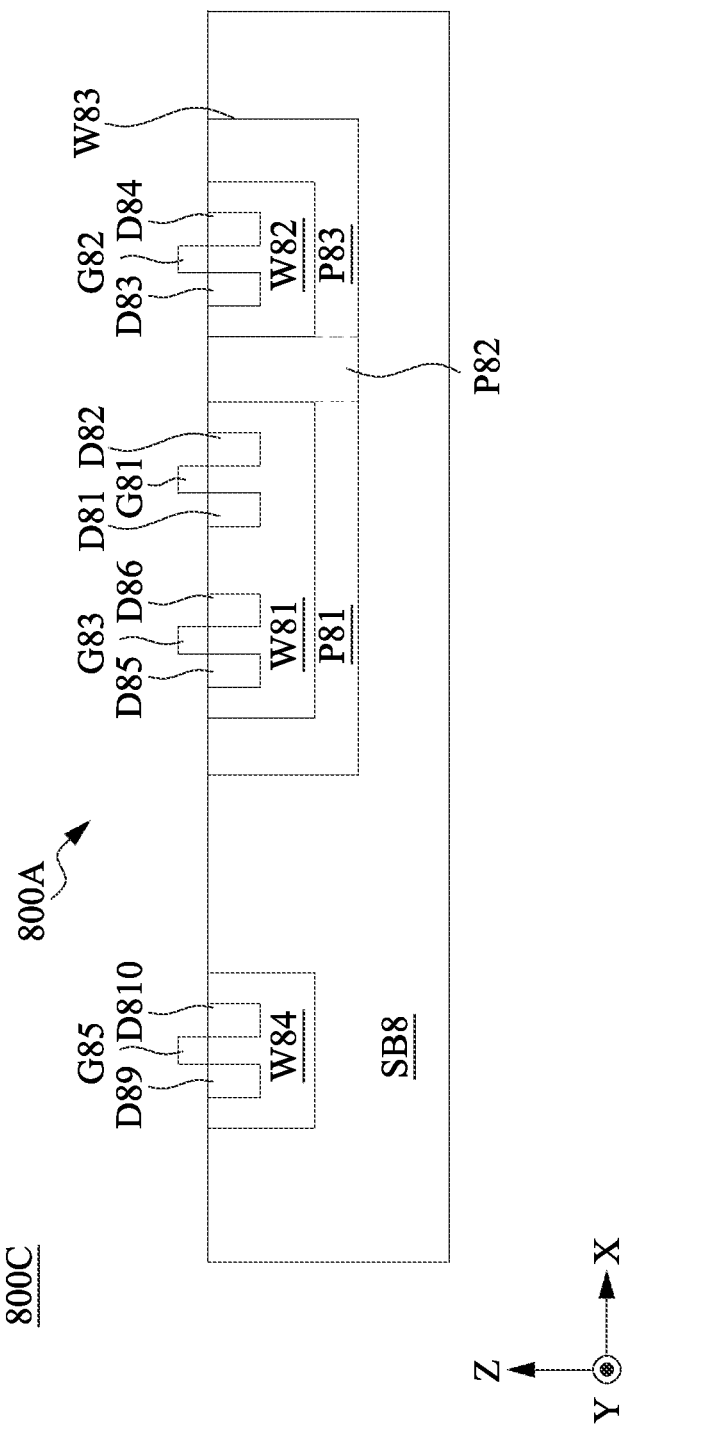
FIG. 8C is a cross section diagram of the semiconductor device along a line shown in FIG. 8B, in accordance with some embodiments of the present disclosure.

FIG. 8C is a cross section diagram 800C of the semiconductor device 800A along a line L81 shown in FIG. 8B, in accordance with some embodiments of the present disclosure. As illustratively shown in FIG. 8C, the Y-direction points into the paper. The portion P82 is interposed between the wells W81 and W82, to separate the wells W81 and W82 from each other.

In some embodiments, each of the wells W83, W84 and the doped regions D812, D810 is configured to receive the reference voltage signal VDD. Each of the gate structures G82, G83 and G85 is configured to receive the input voltage signal VIN. Each of the well W82 and the doped region D84 is configured to receive the reference voltage signal VSS.

In some embodiments, each of the substrate SB8, the doped regions D89-D812 and the wells W81, W82 corresponds to the second conductive type, and each of the doped regions D81-D88 and the wells W83-W84 corresponds to the first conductive type. For example, each of the substrate SB8, the doped regions D89-D812 and the wells W81, W82 is implemented by P-type materials, and each of the doped regions D81-D88 and the wells W83-W84 is implemented by N-type materials.

Also disclosed is a semiconductor device. The semiconductor device includes a first well and a second well. The first well is configured to operate as a back gate terminal of a first transistor. The second well is separated from the first well, and is configured to operate as a back gate terminal of a second transistor. Each of a first source/drain terminal of the second transistor, and a first source/drain terminal of the first transistor and the back gate terminal of the first transistor are coupled to each other.

Also disclosed is a semiconductor device. The semiconductor device includes a first transistor and a second transistor. A first source/drain terminal of the first transistor has a first voltage level, and a second source/drain terminal of the first transistor has a second voltage level and coupled to a back gate terminal of the first transistor. A first source/drain terminal of the second transistor is coupled to a back gate terminal of the first transistor, and a second source/drain terminal of the first transistor has a third voltage level and coupled to a back gate terminal of the second transistor. The second voltage level is between the first voltage level and the third voltage level.

Also disclosed is a method. The method includes: forming a first well above a second well; forming a third well above the second well; forming a portion of the second well between the first well and the third well to separate the first well and the third well from each other, forming a first doped region and a second doped region in the first well; forming a first gate structure between the first doped region and the second doped region; forming a third doped region and a fourth doped region in the third well; forming a second gate structure between the first doped region and the second doped region; and coupling the first well to the second doped region and the third doped region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a first well above a second well;

forming a third well above the second well;

forming a portion of the second well between the first well and the third well to separate the first well and the third well from each other, forming a first doped region and a second doped region in the first well;

forming a first gate structure between the first doped region and the second doped region;

forming a third doped region and a fourth doped region in the third well;

forming a second gate structure between the third doped region and the fourth doped region;

coupling the first well to the second doped region and the third doped region;

forming a fifth doped region and a sixth doped region in the first well;

forming a third gate structure between the fifth doped region and the sixth doped region; and coupling the third gate structure to the second gate structure.

2. The method of claim 1, further comprising:

forming a seventh doped region and an eighth doped region in the first well;

forming a fourth gate structure between the seventh doped region and the eighth doped region;

coupling the fourth gate structure to the fifth doped region;

coupling each of the sixth doped region and the eighth doped region to the first well; and coupling the seventh doped region to the first gate structure.

3. The method of claim 2, further comprising:

forming a ninth doped region, a tenth doped region, an eleventh doped region and a twelfth doped region;

forming a fifth gate structure between the ninth doped region and the tenth doped region;

forming a sixth gate structure between the eleventh doped region and the twelfth doped region;

coupling the fifth gate structure to the third gate structure;

coupling the sixth gate structure to the fourth gate structure; and

coupling the eleventh doped region to the first gate structure.

4. A method, comprising:
forming a substrate;
forming a first well above a second well in the substrate;
forming a third well above the second well;
forming a fourth well separated from the second well in the substrate;
forming a portion of the second well between the first well and the third well to separate the first well and the third well from each other,
forming a first doped region and a second doped region in the first well;
forming a first gate structure between the first doped region and the second doped region; and
forming a third doped region in the fourth well; and
forming a fourth doped region in the third well,
wherein the fourth doped region is coupled to the second doped region,
wherein the third doped region is coupled to the first gate structure.

5. The method of claim 4, further comprising:
forming a fifth doped region in the third well; and
forming a second gate structure between the fourth doped region and the fifth doped region.

6. The method of claim 5, further comprising:
forming a sixth doped region and a seventh doped region in the first well; and
forming a third gate structure between the sixth doped region and the seventh doped region,
wherein the third gate structure is coupled to the second gate structure.

7. The method of claim 5, further comprising:
forming a sixth doped region and a seventh doped region in the fourth well; and
forming a third gate structure between the fourth doped region and the fifth doped region,
wherein the third gate structure is coupled to the second gate structure.

8. The method of claim 4, further comprising:
forming a fifth doped region in the fourth well; and
forming a second gate structure between the fifth doped region and the third doped region.

9. The method of claim 8, further comprising:
forming a sixth doped region and a seventh doped region in the first well; and
forming a third gate structure between the sixth doped region and the seventh doped region,
the second gate structure is coupled to the third gate structure.

10. The method of claim 4, further comprising:
forming a fifth doped region in the third well.

11. A method, comprising:
forming a substrate;
forming a first well above a second well in the substrate;
forming a third well separated from the second well in the substrate;
forming a first doped region in the first well; and
forming a second doped region in the third well,

wherein the first doped region is coupled to the second doped region, and
the second well surrounds the first well in a layout view.

12. The method of claim 11, further comprising:
forming a third doped region and a fourth doped region in the third well; and
forming a first gate structure between the third doped region and the fourth doped region,
wherein the first gate structure is coupled to the second doped region.

13. The method of claim 12, further comprising:
forming a fifth doped region and a sixth doped region in the third well; and
forming a second gate structure between the fifth doped region and the sixth doped region,
wherein the first gate structure is coupled to the second gate structure.

14. The method of claim 12, further comprising:
forming a fifth doped region and a sixth doped region in the first well; and
forming a second gate structure between the fifth doped region and the sixth doped region,
wherein the second gate structure is coupled to the third doped region.

15. The method of claim 14, wherein the first doped region is disposed between the second gate structure and the second doped region.

16. The method of claim 11, further comprising:
forming a third doped region in the third well; and
forming a first gate structure between the third doped region and the second doped region,
wherein the first gate structure is disposed between the second doped region and the second well.

17. The method of claim 16, further comprising:
forming a fourth well above the second well;
forming a portion of the second well between the first well and the fourth well to separate the first well and the fourth well from each other;
forming a fourth doped region and a fifth doped region in the fourth well; and
forming a second gate structure between the fourth doped region and the fifth doped region,
wherein the second gate structure is coupled to the first gate structure.

18. The method of claim 17, wherein the first well is disposed between the fourth well and the third well.

19. The method of claim 17, further comprising:
forming a sixth doped region and a seventh doped region in the first well; and
forming a third gate structure between the sixth doped region and the seventh doped region,
wherein the first doped region is coupled to the third gate structure.

20. The method of claim 11, further comprising:
forming a first gate structure on the first well; and
forming a second gate structure on the third well,
wherein the first gate structure is coupled to the second gate structure.

* * * * *